(12) United States Patent
Huang et al.

(10) Patent No.: US 12,089,449 B2
(45) Date of Patent: Sep. 10, 2024

(54) DISPLAY PANEL AND DISPLAY APPARATUS

(71) Applicant: BOE TECHNOLOGY GROUP CO., LTD., Beijing (CN)

(72) Inventors: Haitao Huang, Beijing (CN); Chuanxiang Xu, Beijing (CN); Shi Shu, Beijing (CN); Yong Yu, Beijing (CN); Renquan Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 17/424,747

(22) PCT Filed: Sep. 29, 2020

(86) PCT No.: PCT/CN2020/118992
§ 371 (c)(1),
(2) Date: Jul. 21, 2021

(87) PCT Pub. No.: WO2022/067551
PCT Pub. Date: Apr. 7, 2022

(65) Prior Publication Data
US 2022/0157903 A1  May 19, 2022

(51) Int. Cl.
*H10K 59/122* (2023.01)
*H10K 50/86* (2023.01)
*H10K 59/121* (2023.01)
*H10K 59/38* (2023.01)

(52) U.S. Cl.
CPC ......... *H10K 59/122* (2023.02); *H10K 50/865* (2023.02); *H10K 59/1213* (2023.02); *H10K 59/38* (2023.02)

(58) Field of Classification Search
CPC .................................................. H10K 59/122
See application file for complete search history.

(56) References Cited

U.S. PATENT DOCUMENTS

2009/0194780 A1  8/2009  Kwon
2010/0052519 A1*  3/2010  Jeon ................. H10K 50/841
                                                              313/504

FOREIGN PATENT DOCUMENTS

| CN | 101556991 A | 10/2009 |
| CN | 109786578 A | 5/2019 |
| CN | 111326636 A | 6/2020 |
| CN | 111430571 A | 7/2020 |
| CN | 211578756 U | 9/2020 |
| KR | 10-2013-0030148 A | 3/2013 |

* cited by examiner

*Primary Examiner* — Yu-Hsi D Sun
(74) *Attorney, Agent, or Firm* — IP & T GROUP LLP

(57) ABSTRACT

A display panel includes: a base; a pixel defining layer disposed on a side of the base; a plurality of light-emitting devices disposed on a side of the base; and at least one connection portion disposed on a side of the pixel defining layer away from the base. The pixel defining layer has a plurality of first openings. At least a portion of each light-emitting device is located in a first opening. An orthogonal projection of a connection portion on the base is located within an orthogonal projection of the pixel defining layer on the base. A surface of the connection portion away from the base has a plurality of protrusions, and the connection portion is configured to diffusely reflect external ambient light incident into the display panel.

13 Claims, 16 Drawing Sheets

| Viewing angle | OLED cathode specular reflection | | Second electrode diffuse reflection | |
|---|---|---|---|---|
| | Color coordinates (x, y) | Chromatic aberration | Color coordinates (x, y) | Chromatic aberration |
| 15° | (0.208, 0.550) | 0.250 | (0.202, 0.108) | 0.236 |
| 30° | (0.311, 0.321) | 0.0002 | (0.311, 0.321) | 0.0002 |
| 45° | (0.166, 0.131) | 0.239 | (0.230, 0.254) | 0.105 |

| Viewing angle | OLED cathode specular reflection | | Second electrode diffuse reflection | |
|---|---|---|---|---|
| | Color coordinates (x, y) | Chromatic aberration | Color coordinates (x, y) | Chromatic aberration |
| 15° | (0.124, 0.701) | 0.423 | (0.155, 0.145) | 0.235 |
| 30° | (0.311, 0.321) | 0.0002 | (0.311, 0.321) | 0.0002 |
| 45° | (0.452, 0.254) | 0.156 | (0.155, 0.149) | 0.211 |

DISPLAY PANEL AND DISPLAY APPARATUS

CROSS-REFERENCE TO RELATED APPLICATION

This application is a national phase entry under 35 USC 371 of International Patent Application No. PCT/CN2020/118992 filed on Sep. 29, 2020, which is incorporated herein by reference in its entirety.

TECHNICAL FIELD

The present disclosure relates to the field of display technologies, and in particular, to a display panel and a display apparatus.

BACKGROUND

Organic light-emitting diode (OLED) display apparatuses and quantum dot light-emitting diodes (QLED) display apparatuses have become a hot spot pursued and adopted by current display products due to their advantages of thinness, lightness, wide viewing angle, active luminescence, continuously tunable luminous color, low cost, fast response speed, low energy consumption, low driving voltage, wide operating temperature range, simple production process, and high luminous efficiency, and the like.

SUMMARY

In an aspect, a display panel is provided. The display panel includes: a base, a pixel defining layer disposed on a side of the base, a plurality of light-emitting devices disposed on a side of the base, and at least one connection portion disposed on a side of the pixel defining layer away from the base. The pixel defining layer has a plurality of first openings. At least a portion of each light-emitting device is located in a first opening. The light-emitting device includes a first electrode, a light-emitting layer, and a second electrode that are sequentially stacked in a direction perpendicular to the base and away from the base. An orthogonal projection of a connection portion on the base is located within an orthogonal projection of the pixel defining layer on the base. The connection portion and the second electrode are made of a same material and disposed in a same layer, and the connection portion is electrically connected to at least two adjacent second electrodes. A surface of the connection portion away from the base has a plurality of protrusions, and the connection portion is configured to diffusely reflect external ambient light incident into the display panel.

In some embodiments, a surface of a portion of the pixel defining layer in contact with the connection portion is uneven. A shape of the surface of the portion of the pixel defining layer in contact with the connection portion matches a shape of the connection portion.

In some embodiments, the display panel further includes a planarization layer, the pixel defining layer and a first electrode layer where a plurality of first electrodes are located are disposed on a side of the planarization layer away from the base. A surface, away from the base, of a portion of the planarization layer opposite to the connection portion is uneven. A surface of a portion of the pixel defining layer in contact with the uneven surface of the portion of the planarization layer is uneven and matches both a shape of the uneven surface of the portion of the planarization layer and a shape of the connection portion.

In some embodiments, the display panel further includes: a planarization layer, a plurality of pixel driving circuits disposed between the base and the planarization layer, and electrically connected to the plurality of light-emitting devices, and a plurality of first bumps with a same material and disposed in a same layer as sources and drains of a plurality of thin film transistors in the plurality of pixel driving circuits. The pixel defining layer and a first electrode layer where a plurality of first electrodes are located are disposed on a side of the planarization layer away from the base. Orthogonal projections of the plurality of first bumps on the base are located within the orthogonal projection of the at least one connection portion on the base. A portion of the planarization layer and a portion of the pixel defining layer covering the plurality of first bumps are uneven, and match a shape of the connection portion.

In some embodiments, in the direction perpendicular to the base, dimensions of the plurality of first bumps are in a range of 5000 Å to 9000 Å.

In some embodiments, in a direction parallel to the base, dimensions of the plurality of first bumps are in a range of 1 μm to 4 μm.

In some embodiments, in the plurality of first bumps, a distance between two adjacent first bumps is in a range of 0.5 μm to 1.5 μm.

In some embodiments, a minimum distance of a plurality of distances between edges of orthogonal projections of the plurality of first bumps on the base and an edge of the orthogonal projection of the pixel defining layer on the base is in a range of 2 μm to 8 μm.

In some embodiments, the display panel further includes: a plurality of post spacers disposed on a side of the pixel defining layer away from the base, and a plurality of second bumps disposed between the pixel defining layer and the connection portion. The plurality of second bumps and the plurality of post spacers are made of a same material and disposed in a same layer. A shape of the connection portion matches shapes of the plurality of second bumps.

In some embodiments, in a direction parallel to the base, dimensions of the plurality of second bumps are in a range of 0.5 μm to 3 μm.

In some embodiments, in the plurality of second bumps, a distance between two adjacent second bumps is greater than 0 μm and less than or equal to 3 μm.

In some embodiments, a minimum distance of a plurality of distances between edges of orthogonal projections of the plurality of second bumps on the base and an edge of the orthogonal projection of the pixel defining layer on the base is in a range of 2 μm to 8 μm.

In some embodiments, a shape of the orthogonal projection of the connection portion on the base has a block shape, a strip shape, or a shape formed by connecting a plurality of strip shapes.

In some embodiments, a number of the at least one connection portion is one. A shape of the orthogonal projection of the connection portion on the base is the same as a shape of the orthogonal projection of the pixel defining layer on the base. The connection portion is electrically connected to second electrodes of the plurality of light-emitting devices.

In some embodiments, a minimum distance between an edge of the orthogonal projection of the connection portion on the base and an edge of the orthogonal projection of the pixel defining layer on the base is in a range of 0 μm to 8 μm.

In some embodiments, in the direction perpendicular to the base, dimensions of the plurality of protrusions are greater than 0 μm and less than or equal to 2 μm.

In some embodiments, a shape of an orthogonal projection of a protrusion on the base has a strip shape, a circle shape, or a polygon shape.

In another aspect, a display apparatus is provided. The display apparatus includes: the display panel according to any one of the above embodiments, a black matrix disposed on a light exit side of the display panel, and a color filter layer disposed on a side of the black matrix away from the display panel. The black matrix has a plurality of second openings. The color filter layer includes a plurality of color filter portions, and at least a portion of a color filter portion is located in a second opening. A minimum distance between an edge of an orthogonal projection of the black matrix on the base of the display panel and an edge of an orthogonal projection of the at least one connection portion of the display panel on the base is in a range of 0 μm to 6 μm.

In some embodiments, the display apparatus further includes: a touch structure disposed between the display panel and the black matrix. An orthogonal projection of the touch structure on the base is within an orthogonal projection of the black matrix on the base.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, and an actual process of a method to which the embodiments of the present disclosure relate.

DETAILED DESCRIPTION

Figure 1:
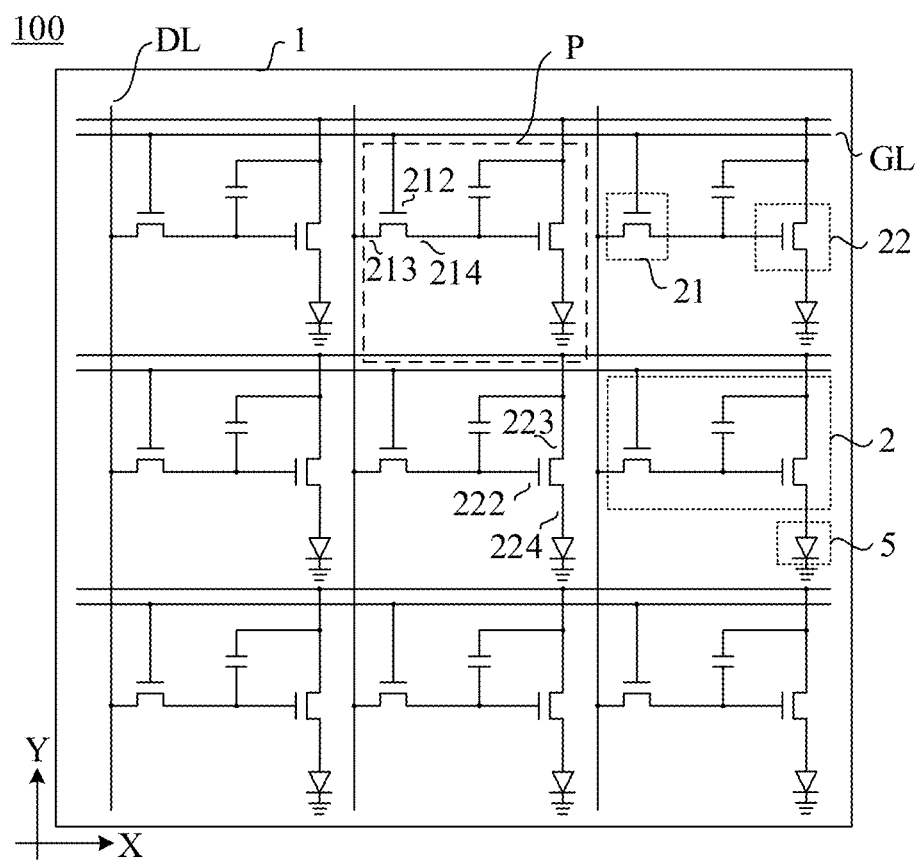
FIG. 1 is a diagram showing a structure of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expression "connected" and its derivate may be used. For example, the term "connected" may be used in the description of some embodiments to indicate that two or more components are in direct physical contact or electrical contact with each other. The embodiments disclosed herein are not necessarily limited to the contents herein.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or other than the stated values.

The term such as "about" or "approximately" as used herein includes a stated value and an average value within an acceptable range of deviation of a particular value. The acceptable range of deviation is determined by a person of ordinary skill in the art, in consideration of measurement in question and error associated with the measurement of a particular quantity (i.e., limitations of a measurement system).

Exemplary embodiments are described herein with reference to cross-sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the region in an apparatus, and are not intended to limit the scope of the exemplary embodiments.

An OLED display apparatus that is a top-emission OLED display apparatus is taken as an example. In a case where external ambient light is irradiated from a light exit side of the OLED display apparatus to the inside of the OLED display apparatus, structures in the OLED display apparatus (e.g., metal wires, and anodes of the OLED) are prone to reflect external light, which may adversely affect a display effect of the OLED display apparatus. Therefore, the OLED display apparatus usually further includes a circular polarizer disposed on the light exit side thereof, so as to reduce the reflection of the external ambient light through the circular polarizer.

In an implementation manner, the circular polarizer in the OLED display apparatus may be replaced with a black matrix and a color filter layer that are arranged on the light exit side of the OLED display apparatus. In this way, it may not only be possible to achieve an effect of reducing the reflection of the external ambient light using the black matrix and the color filter layer, but also be possible to improve problems of large overall thickness of the OLED display apparatus and difficulty in achieving flexible display due to large thickness and brittleness of the circular polarizer itself.

However, after replacing the circular polarizer with the black matrix and the color filter layer, light intensity distribution of the external ambient light reflected by different sub-pixels of the OLED display apparatus has changed, which leads to a color separation phenomenon in a dark state of the OLED display apparatus. That is, in a case where the OLED display apparatus is in an off-screen state and there is light irradiating the OLED display apparatus, it is easy to see a relatively obvious color separation phenomenon of reflected light, which affects an off-screen display effect of the OLED display apparatus.

The inventors of the present disclosure discovered in the research process that anodes of the OLED have small effect on the color separation phenomenon, and cathodes of the OLED have large effect on the color separation phenomenon.

On this basis, some embodiments of the present disclosure provide a display panel 100.

In some examples, as shown in FIGS. 1 to 8, the display panel 100 includes a base 1.

The base 1 may be of various structures, which may be selected and set according to actual needs. For example, the base 1 may be a blank base substrate. For another example, the base 1 may include a blank base substrate and at least one functional film (e.g., an insulating layer and/or a buffer layer) disposed on the blank base substrate.

The blank base substrate may be of various structures, which may be selected and set according to actual needs.

For example, the blank base substrate may be a rigid base substrate. The rigid base substrate may be, for example, a glass base substrate or a polymethyl methacrylate (PMMA) base substrate.

For another example, the blank base substrate may be a flexible base substrate. The flexible base substrate may be, for example, a polyethylene terephthalate (PET) base substrate, a polyethylene naphthalate two formic acid glycol ester (PEN) base substrate or a polyimide (PI) base substrate.

In some examples, as shown in FIG. 1, the display panel 100 further includes: a plurality of gate lines GL disposed on a side of the base 1 and extending in a first direction X, and a plurality of data lines DL disposed on a side of the base 1 and extending in a second direction Y. For example, the plurality of data lines DL are located on a side of the plurality of gate lines GL away from the base 1, and the plurality of data lines DL and the plurality of gate lines GL are insulated from each other.

Here, in a case where the base 1 includes a blank base substrate and at least one functional film disposed on the blank base substrate, the plurality of gate lines GL may be located on a side of the at least one functional film away from the blank base substrate.

For example, as shown in FIG. 1, the plurality of gate lines GL and the plurality of data lines DL are arranged to cross each other to define a plurality of sub-pixel regions P. This means that the first direction X and the second direction Y cross each other.

An included angle between the second direction Y and the first direction X may be selected and set according to actual needs. For example, the second direction Y and the first direction X may be perpendicular to each other, that is, the included angle between the two is 90°. In this case, the plurality of gate lines GL and the plurality of data lines DL are perpendicular to or approximately perpendicular to each other.

In some examples, as shown in FIG. 1, the display panel 100 further includes a plurality of pixel driving circuits 2 disposed on a side of the base 1 and located in the plurality of sub-pixel regions P.

For example, as shown in FIG. 1, sub-pixel regions P arranged in a row in the first direction X may be referred to as sub-pixel regions P in a same row, and sub-pixel regions P arranged in a column in the second direction Y may be referred to as sub-pixel regions P in a same column. Pixel driving circuits 2 of the sub-pixel regions P in a same row may be electrically connected to a gate line GL, and pixel driving circuits 2 of the sub-pixel regions P in a same column may be electrically connected to a data line DL.

Of course, the pixel driving circuits 2 of the sub-pixel regions P in the same row may also be electrically connected to multiple gate lines GL, which is not limited in the embodiments of the present invention.

The pixel driving circuit 2 may be of various structures, which may be selected and set according to actual needs. For example, the structure of the pixel driving circuit 2 may include structures such as "2T1C", "6T1C", "7T1C", "6T2C" or "7T2C". Here, "T" represents a thin film transistor, and the number before "T" represents the number of thin film transistors, "C" represents a storage capacitor, and the number before "C" represents the number of storage capacitor(s). The plurality of thin film transistors included in a pixel driving circuit 2 include a switching transistor 21 and a driving transistor 22.

Here, the switching transistor 21 refers to a thin film transistor that is electrically connected to the gate line GL and the data line DL, among the plurality of thin film transistors included in the pixel driving circuit 2.

The driving transistor 22 refers to a thin film transistor that is electrically connected to the switching transistor 21 and a light-emitting device 5, among the plurality of thin film transistors included in the pixel driving circuit 2. The driving transistor 22 and the light-emitting device 5 may be directly electrically connected (as shown in FIG. 1), or may be indirectly electrically connected, which may be selected and set according to the structure of the pixel driving circuit 2. As for the light-emitting device 5, reference may be made to the content schematically described later herein.

Below, the structure of the display panel 100 is schematically described by taking an example where the structure of the pixel driving circuit 2 is the "2T1C" structure.

As shown in FIGS. 4 to 8, the switching transistor 21 and the driving transistor 22 in the pixel driving circuit 2 may adopt a same type of thin film transistors, or may adopt different types of thin film transistors. In a case where the switching transistor 21 and the driving transistor 22 adopt the same type of thin film transistors, both of them may adopt top-gate thin film transistors, or may adopt bottom-gate thin film transistors.

For example, as shown in FIGS. 4 to 8, the switching transistor 21 and the driving transistor 22 both adopt top-gate thin film transistors. In this case, the switching transistor 21 may include: a first active layer 211 disposed on a side of the base 1, a first gate 212 disposed on a side of the first active layer 211 away from the base 1, and a first source 213 and a first drain 214 disposed on a side of the first gate 212 away from the base 1. The first source 213 and the first drain 214 are electrically connected to the first active layer 211. The driving transistor 22 may include: a second active layer 221 disposed on the side of the base 1, a second gate 222 disposed on a side of the second active layer 221 away from the base 1, and a second source 223 and a second drain 224 disposed on a side of the second gate 222 away from the base 1. The second source 223 and the second drain 224 are electrically connected to the second active layer 221.

For example, as shown in FIG. 1, the first gate 212 of the switching transistor 21 may be electrically connected to a gate line GL, one of the first source 213 and the first drain 214 of the switching transistor 21 (e.g., the first source 213) may be electrically connected to a data line DL, and the other (e.g., the first drain 214) may be electrically connected to the second gate 222 of the driving transistor 22. One of the second source 223 and the second drain 224 (e.g., the second drain 224) of the driving transistor 22 may be electrically connected to the light-emitting device 5.

For example, the first active layer 211 of the switching transistor 21 and the second active layer 221 of the driving transistor 22 may be disposed in a same layer. The first gate 212 of the switching transistor 21, the second gate 222 of the driving transistor 22, and the plurality of gate lines GL may be disposed in a same layer. The first source 213 and the first drain 214 of the switching transistor 21, the second source 223 and the second drain 224 of the driving transistor 22, and the plurality of data lines DL may be disposed in a same layer.

It will be noted that, the "same layer" mentioned herein refers to that: a film for forming a specific pattern is formed first by using a same film-forming process and then a patterning process is performed on the film by using a same mask to form layer structure with specific patterns. Depending on different specific patterns, the patterning process may include multiple exposure, development or etching processes, and the specific patterns in the formed layer structure may be continuous or discontinuous, and these specific patterns may also be at different heights or have different thicknesses. In this way, the first active layer 211 and the second active layer 221 may be formed simultaneously in a patterning process, a gate conductive layer including the first gate 212, the second gate 222 and the gate line GL may be formed simultaneously in a patterning process, and a source-drain conductive layer including the first source 213, the first drain 214, the second source 223, the second drain 224, and the data line DL may be formed simultaneously in a patterning process, which may be beneficial to simplifying the manufacturing process of display panel 100.

In some examples, as shown in FIGS. 4 to 8, the display panel 100 further includes a planarization layer 3 disposed on a side of the plurality of pixel driving circuits 2 away from the base 1.

For example, the planarization layer 3 is of a planar structure. The planarization layer 3 covers the plurality of pixel driving circuits 2 and planarizes a surface of the plurality of pixel driving circuits 2 away from the base 1, which is beneficial to improving the flatness of the structure formed later on a side of the planarization layer 3 away from the base 1.

In some examples, as shown in FIGS. 4 to 8, the display panel 100 further includes: a pixel defining layer 4 disposed on a side of the base 1 (that is, the side of the planarization layer 3 away from the base 1).

For example, the pixel defining layer 4 has a plurality of first openings K1. An first opening K1 may, for example, correspond to a sub-pixel region P.

In some examples, as shown in FIG. 1 and FIGS. 4 to 8, the display panel 100 further includes a plurality of light-emitting devices 5 disposed on a side of the base 1. At least a portion of each light-emitting device 5 is located in a first opening K1. Correspondingly, a light-emitting device 5 is located in a sub-pixel region P.

The light-emitting device 5 may be of various structures, which may be selected and set according to actual needs.

For example, as shown in FIGS. 4 to 8, the light-emitting device 5 may include a first electrode 51, a light-emitting layer 52 and a second electrode 53 that are sequentially stacked in a direction perpendicular to the base 1 and away from the base 1.

Here, the first electrode 51 may be formed prior to the pixel defining layer 4. That is, after the planarization layer 3 is formed, a patterning process may be used to form a first electrode layer including a plurality of first electrodes 51 on the side of the planarization layer 3 away from the base 1 first. The plurality of first electrodes 51 may be located in the plurality of sub-pixel regions P, and are each electrically connected to a pixel driving circuit 2 (e.g., the second drain 224 of the driving transistor 22 in the pixel driving circuit 2) through a via hole in the planarization layer 3 located in a sub-pixel region P. After forming the first electrode layer, the pixel defining layer 4 may be formed on a side of the first electrode layer away from the base 1. On this basis, at least a portion of the first electrode 51 is located in a corresponding first opening K1 in a same sub-pixel region P. For example, the entire first electrode 51 is located in the corresponding first opening K1. For another example, as shown in FIGS. 4 to 8, a portion of the first electrode 51 is located in the corresponding first opening K1, and the other portion is located between the planarization layer 3 and the pixel defining layer 4. In this case, a minimum distance between an edge of an orthogonal projection of the first opening K1 on the base 1 and an edge of an orthogonal projection of the first electrode 51 on the base 1 may be in a range of 2 μm to 4 μm.

Figure 4:
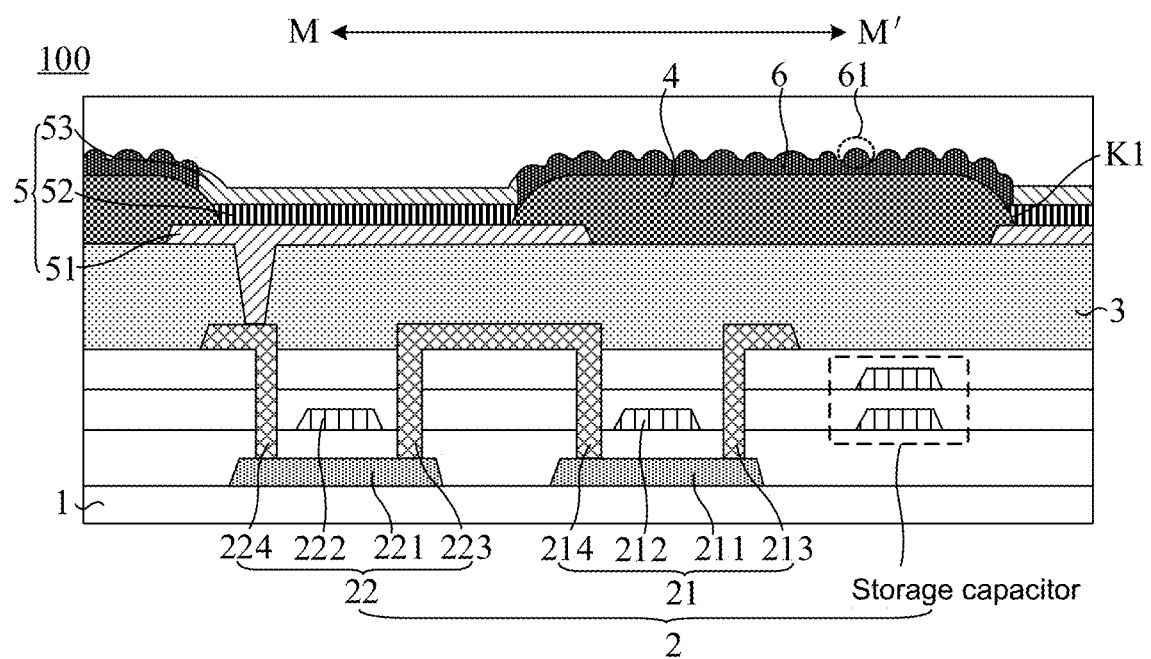
FIG. 4 is a cross-sectional view of the display panel in FIG. 3 taken along the M-M' direction.
Figure 5:
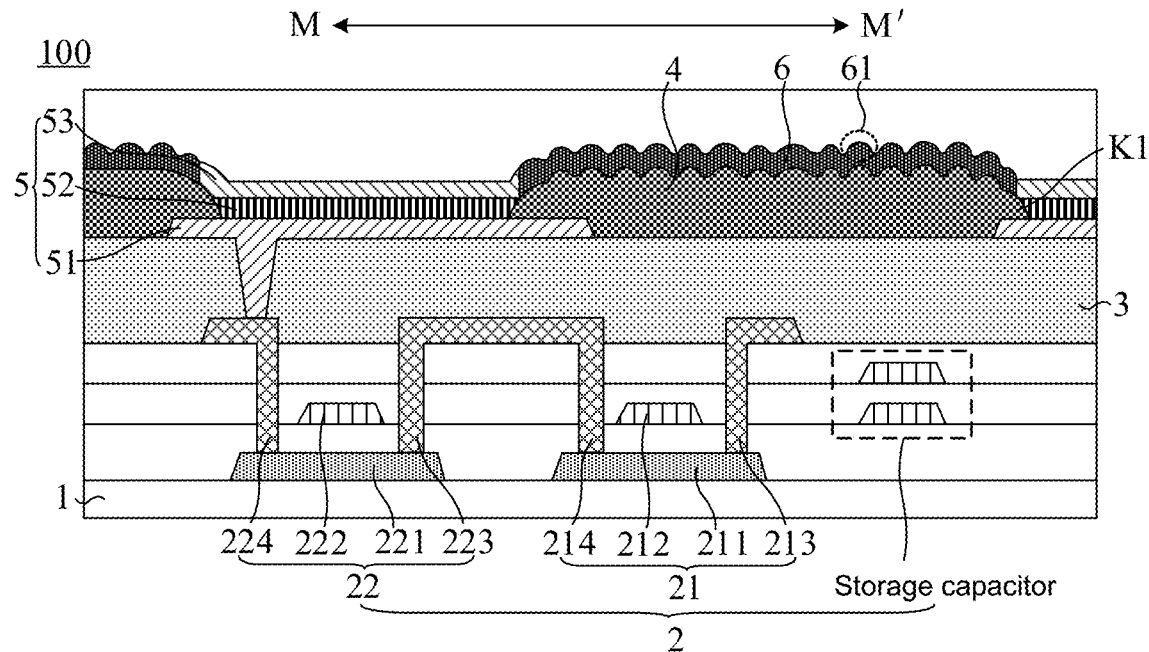
FIG. 5 is another cross-sectional view of the display panel shown in FIG. 3 taken along the M-M' direction.
Figure 6:
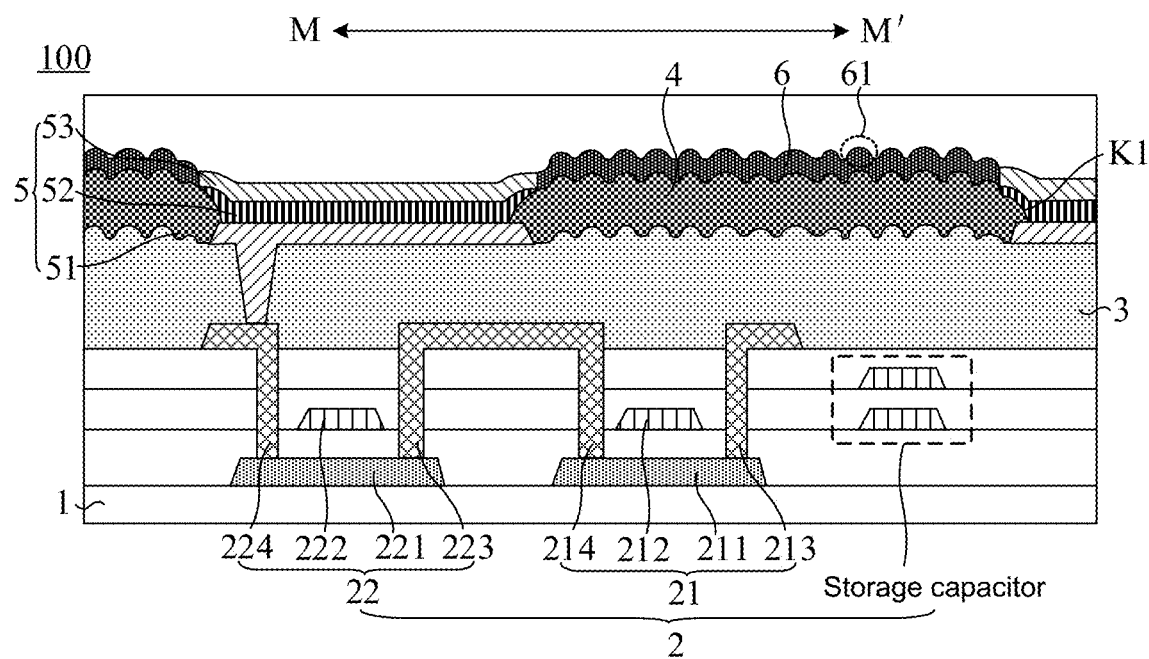
FIG. 6 is yet another cross-sectional view of the display panel shown in FIG. 3 taken along the M-M' direction.
Figure 7:
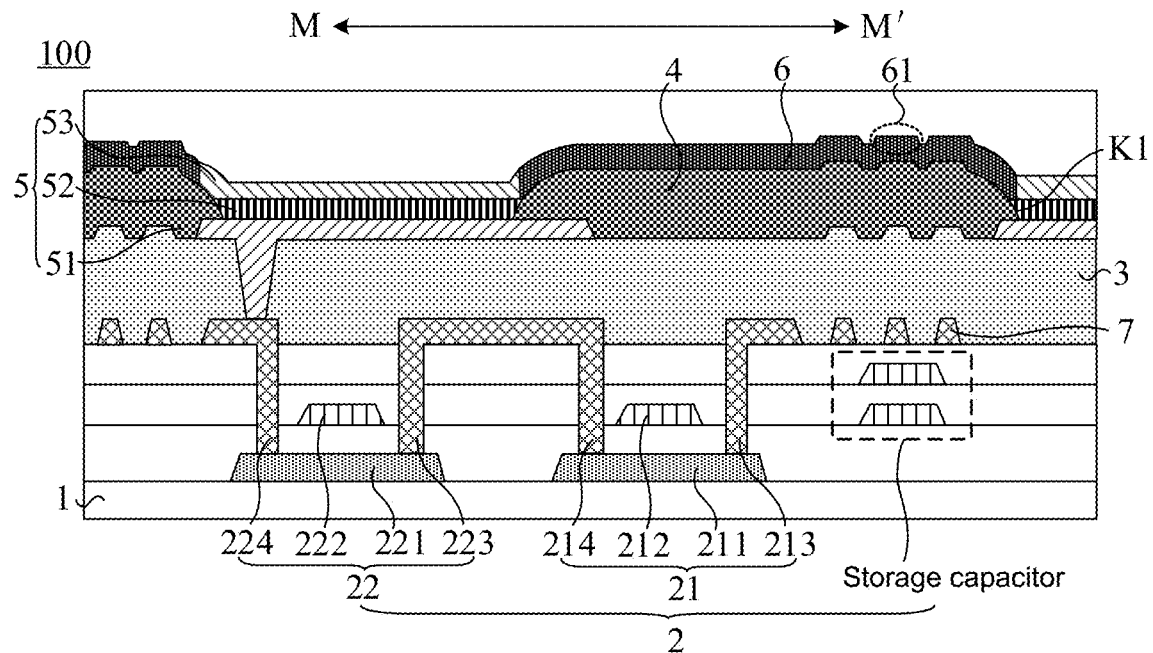
FIG. 7 is yet another cross-sectional view of the display panel shown in FIG. 3 taken along the M-M' direction.
Figure 8:
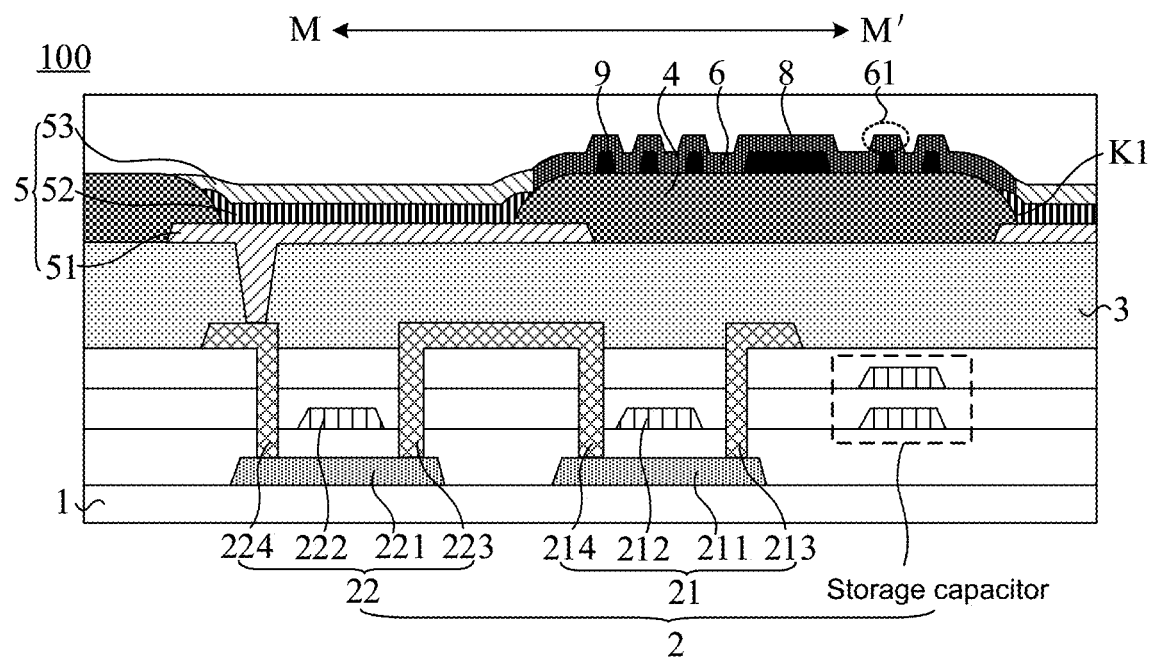
FIG. 8 is yet another cross-sectional view of the display panel shown in FIG. 3 taken along the M-M' direction.

For example, the light-emitting layer 52 may be formed later than the pixel defining layer 4. In the process of manufacturing the light-emitting layer 52, for example, an evaporation process or an ink-jet printing process may be adopted. In a case where the light-emitting layer 52 is manufactured by the evaporation process, at least a portion of the light-emitting layer 52 may be located in the corresponding first opening K1. That is, the entire light-emitting layer 52 may be located in the corresponding first opening K1, or, considering the error of the evaporation process, as shown in FIGS. 6 and 8, a portion of the light-emitting layer 52 may be located in the corresponding first opening K1, and the other portion may cover a portion of the surface of the pixel defining layer 4 away from the base 1 that surrounds the corresponding first opening K1. In a case where the light-emitting layer 52 is manufactured by the ink-jet printing process, as shown in FIGS. 4, 5, and 7, the entire light-emitting layer 52 may be located in the corresponding first opening K1.

For example, as shown in FIGS. 4 to 8, at least a portion of the second electrode 53 may be located in the corresponding first opening K1. That is, the entire second electrode 53 may be located in the corresponding first opening K1, or a portion of the second electrode 53 may be located in the corresponding first opening K1, and the other portion may cover a portion of the surface of the pixel defining layer 4 away from the base 1 that surrounds the corresponding first opening K1.

For example, in the light-emitting device 5, the first electrode 51 may be an anode, and correspondingly, the second electrode 53 may be a cathode; or, the first electrode 51 may be a cathode, and correspondingly, the second electrode 53 may be an anode.

In an example where the first electrode 51 is an anode and the second electrode 53 is a cathode, in some examples, the display panel 100 further includes a signal line electrically connected to the second electrodes 53. During the image display process of the display panel 100, the pixel driving circuit 2 electrically connected to the light-emitting device 5 may provide the light-emitting device 5 with a first voltage signal, a signal line electrically connected to the light-emitting device 5 may provide the light-emitting device 5 with a second voltage signal, and the first voltage signal and the second voltage signal may cooperate with each other to control the light-emitting state of the light-emitting device 5. A voltage of the first voltage signal is higher than a voltage of the second voltage signal.

Of course, the structure of the light-emitting device 5 may further include a hole injection layer and/or a hole transport layer disposed between the first electrode 51 (i.e., the anode) and the light-emitting layer 52. The light-emitting device 5 may further include an electron transport layer and/or an electron injection layer disposed between the light-emitting layer 52 and the second electrode 53 (i.e., the cathode).

In some examples, as shown in FIGS. 2 to 8, the display panel 100 further includes at least one connection portion 6 disposed on the side of the pixel defining layer 4 away from the base 1.

For example, as shown in FIGS. 4 to 8, the connection portion 6 is electrically connected to at least two adjacent second electrodes 53. The at least two second electrodes 53 may be, for example, located on opposite sides of the connection portion 6.

This means that the connection portion 6 and the at least two adjacent second electrodes 53 may be an integrated structure. In the process of manufacturing the connection portion 6 and the second electrode 53, the connection portion 6 and the at least two adjacent second electrodes 53 may be continuous and not disconnected. In this way, the at least two second electrodes 53 may share a same signal line, which is beneficial to reducing the number of signal lines, reducing a space ratio of the signal lines to the display panel 100, and reducing a structural complexity of the display panel 100.

The orthogonal projection of the connection portion 6 on the base 1 may be of various shapes, which may be selected and set according to actual needs.

Figure 2:
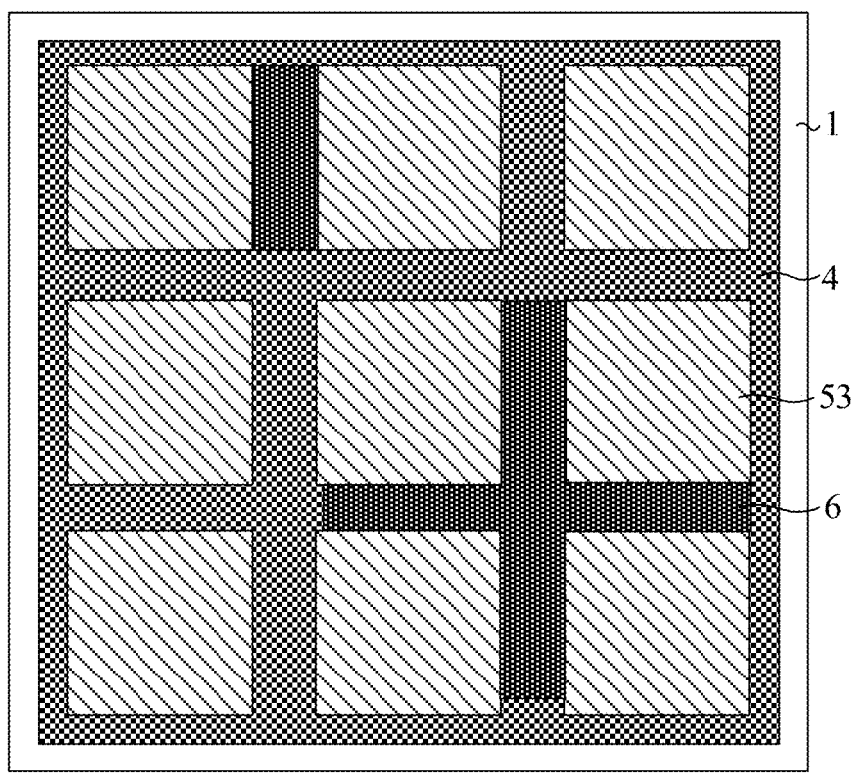
FIG. 2 is a diagram showing a structure of another display panel, in accordance with some embodiments of the present disclosure.
Figure 3:
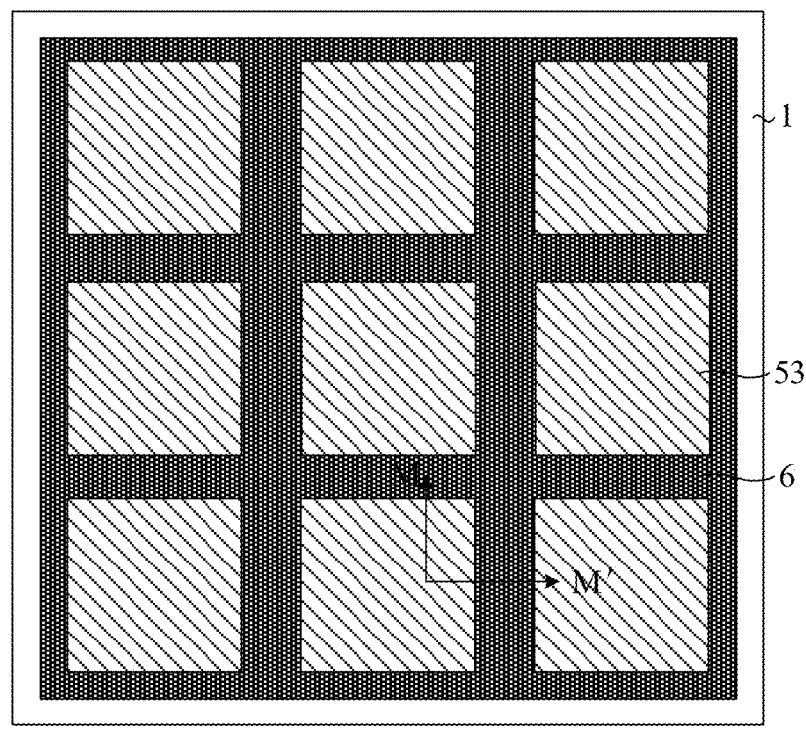
FIG. 3 is a diagram showing a structure of yet another display panel, in accordance with some embodiments of the present disclosure.

For example, as shown in FIGS. 2 and 3, the shape of the orthogonal projection of the connection portion 6 on the base 1 has a block shape, a strip shape, or a shape formed by connecting a plurality of strip shapes.

Here, in a case where the shape of the orthogonal projection of the connection portion 6 on the base 1 is the block shape, the connection portion 6 may be, for example, located between two (but not limited to two) adjacent second electrodes 53. In a case where the shape of the orthogonal projection of the connection portion 6 on the base 1 is the strip shape, the connection portion 6 may be, for example, located between two adjacent rows of the second electrodes 53 sequentially arranged in the first direction X, or may also be located between two adjacent columns of the second electrodes 53 sequentially arranged in the second direction Y. In a case where the shape of the orthogonal projection of the connection portion 6 on the base 1 is the shape formed by connecting the plurality of strip shapes, the connection portion 6 may be, for example, located between two or more adjacent rows of the second electrodes 53 sequentially arranged in the first direction X, and between two or more adjacent columns of the second electrodes 53 sequentially arranged in the second direction Y.

The number of the connection portions 6 may be one or more, as long as it can be electrically connected to the adjacent second electrode 53 and effectively reduce the number of signal lines.

For example, as shown in FIG. 3, the number of the connection portions 6 is one, and the shape of the orthogonal projection of the connection portion 6 on the base 1 is the same as the shape of the orthogonal projection of the pixel defining layer 4 on the base 1. That is, the shape of the orthogonal projection of the connection portion 6 on the base 1 is also a grid shape. On this basis, as shown in FIG. 3, the connection portion 6 may be electrically connected to the plurality of second electrodes 53 in the display panel 100. That is, the connection portion 6 and the plurality of second electrodes 53 may be an integrated structure as a whole. In this way, the plurality of second electrodes 53 included in the display panel 100 may share a same signal line, which is beneficial to further reducing the number of the signal lines and further reducing the structural complexity of the display panel 100.

For example, as shown in FIGS. 4 to 8, the connection portion 6 and the second electrode 53 are made of a same material and are disposed in a same layer.

By arranging the connection portion 6 and the second electrode 53 in a same layer, a same material may be used for manufacturing the connection portion 6 and the second electrode 53 simultaneously in a patterning process, which is beneficial to simplifying the manufacturing process of the display panel 100.

In some examples, as shown in FIGS. 4 to 8, the surface of the connection portion 6 away from the base 1 has a plurality of protrusions 61. The connection portion 6 is configured to diffusely reflect the external ambient light incident into the display panel 100.

Here, the orthogonal projection of the protrusion 61 on the base 1 may be of various shapes. For example, the shape of the orthogonal projection of the protrusion 61 on the base 1 may be a strip, a circle, or a polygon.

In the connection portion 6, the arrangement manner of the plurality of protrusions 61 may be, for example, related to the shape of the orthogonal projection of the protrusion 61 on the base 1.

For example, in a case where the shape of the orthogonal projection of the protrusion 61 on the base 1 is the strip shape, the plurality of protrusions 61 may be, for example, arranged in sequence in the first direction X or in the second direction Y, which is convenient for planning the position of the protrusions 61. In a case where the plurality of protrusions 61 are arranged in sequence in the first direction X, an included angle may be formed between an extending direction of the protrusion 61 and the first direction X, for example, the extending direction of the protrusion 61 may be the second direction Y. In a case where the plurality of protrusions 61 are arranged in sequence in the second direction Y, an included angle may be formed between the extending direction of the protrusion 61 and the second direction Y, for example, the extending direction of the protrusion 61 may be the first direction X.

For example, in a case where the shape of the orthogonal projection of the protrusion 61 on the base 1 is the circle, the plurality of protrusions 61 may be, for example, arranged in an array.

For example, in a case where the shape of the orthogonal projection of the protrusion 61 on the base 1 is the polygon, the plurality of protrusions 61 may be, for example, arranged in an array. The polygon may be, for example, a triangle, a quadrilateral, a pentagon, or a hexagon.

By providing a plurality of protrusions 61 on the surface of the connection portion 6 away from the base 1, the surface of the connection portion 6 away from the base 1 may be made into an uneven rough surface. In this way, in a case where the display panel 100 is in the off-screen state and there is external ambient light irradiating the inside of the display panel 100, the connection portion 6 may be used for diffusely reflecting the external ambient light to scatter the external ambient light. Compared with external ambient light reflected by a mirror surface, the connection portion 6 may be used for destroying the exit direction of the external ambient light, that is, the diffusely reflected external ambient light may exit from more different directions, which is beneficial to reducing a difference in light intensity distribution of the diffusely reflected external ambient light emitted from different sub-pixels of the display panel 100, thereby effectively improving the color separation phenomenon, improving the off-screen display effect of the display panel 100, and enhancing the user experience.

For example, as shown in FIGS. 4 to 8, the orthogonal projection of the connection portion 6 on the base 1 is located within an orthogonal projection of the pixel defining layer 4 on the base 1. That is, in a direction perpendicular to the base 1, the at least one connection portion 6 is only located on the side of the pixel defining layer 4 away from the base 1, and is not located in the opening K1 of the pixel defining layer 4. In this way, it is possible to prevent the protrusion 61 of the connection portion 6 from adversely affecting the normal light emission of the light-emitting device 5.

Thus, in the display panel 100 provided by some embodiments of the present disclosure, by arranging the connecting portion 6 with the protrusions 61 on the side of the pixel defining layer 4 away from the base 1, and making the orthogonal projection of the connection portion 6 on the base 1 within the orthogonal projection of the pixel defining layer 4 on the base 1, it is possible to prevent the connection portion 6 from adversely affecting the normal light emission of the light-emitting device 5, and it may also use the connection portion 6 to diffusely reflect the external ambient light incident into the display panel 100, so that the diffusely reflected external ambient light may spread from different directions. In this way, the connection portion 6 may be used to effectively improve the color separation phenomenon, improve the off-screen display effect of the display panel 100, and improve the user experience.

Moreover, the connection portion 6 and the second electrode 53 may be formed simultaneously in a patterning process without adding other processes, thereby avoiding increasing and prolonging the process flow for manufacturing the display panel 100, and avoiding reducing the production efficiency of the display panel 100, which is beneficial to the mass production of the display panel 100.

It will be noted that, the orthogonal projection of the connection portion 6 on the base 1 is located within the orthogonal projection of the pixel defining layer 4 on the base 1, which means that the minimum distance between an edge of the orthogonal projection of the connection portion 6 on the base 1 and an edge of the orthogonal projection of the pixel defining layer 4 on the base 1 is greater than or equal to 0.

In some examples, the minimum distance between the edge of the orthogonal projection of the connection portion 6 on the base 1 and the edge of the orthogonal projection of the pixel defining layer 4 on the base 1 is in a range of 0 μm to 8 μm. The minimum distance refers to a minimum distance between adjacent portions in the edge of the orthogonal projection of the connection portion 6 on the base 1 and the edge of the orthogonal projection of the pixel defining layer 4 on the base 1.

For example, the minimum distance between the edge of the orthogonal projection of the connection portion 6 on the base 1 and the edge of the orthogonal projection of the pixel defining layer 4 on the base 1 may be 0 μm, 1 μm, 3 μm, 4 μm, 6 μm, or 8 μm. Here, in a case where the minimum distance between the edge of the orthogonal projection of the connection portion 6 on the base 1 and the edge of the orthogonal projection of the pixel defining layer 4 on the base 1 is 0 μm, the orthogonal projection of the connection portion 6 on the base 1 may coincide with the orthogonal projection of the pixel defining layer 4 on the base 1, or a portion of the edge of the orthogonal projection of the connection portion 6 on the base 1 may coincide with a portion of the edge of the orthogonal projection of the pixel defining layer 4 on the base 1.

By setting the minimum distance between the edge of the orthogonal projection of the connection portion 6 on the base 1 and the edge of the orthogonal projection of the pixel defining layer 4 on the base 1 to be in the above range, on the basis of ensuring that the connection portion 6 may avoid adverse effect on the normal light emission of the light-emitting device 5, it may be ensured that the connection portion 6 has a large area, so that the connection portion 6 may well diffusely reflect the external ambient light incident into the display panel 100, thereby ensuring a good improvement effect on the color separation phenomenon.

In some embodiments, in the direction perpendicular to the base 1, dimensions of the plurality of protrusions 61 are greater than 0 μm, and less than or equal to 2 μm.

By setting the dimensions of the plurality of protrusions 61 in the direction perpendicular to the base 1 to be greater than 0 μm, it can be ensured that the protrusions 61 have a certain thickness (that is, the dimensions in the direction perpendicular to the base 1). By setting the dimensions of the plurality of protrusions 61 in the direction perpendicular to the base 1 to be less than or equal to 2 μm, the dimension of the connection portion 6 in the direction perpendicular to the base 1 may be less than or equal to 2 μm, so that the connection portion 6 as a whole may be integrated, thereby ensuring a good effect of electrical connection between the at least two second electrodes 53 electrically connected to the connection portion 6.

For example, in the direction perpendicular to the base 1, the dimensions of the plurality of protrusions 61 may be 0.5 μm, 0.9 μm, 1.3 μm, 1.5 μm, 1.8 μm, or 2 μm.

Figure 9:
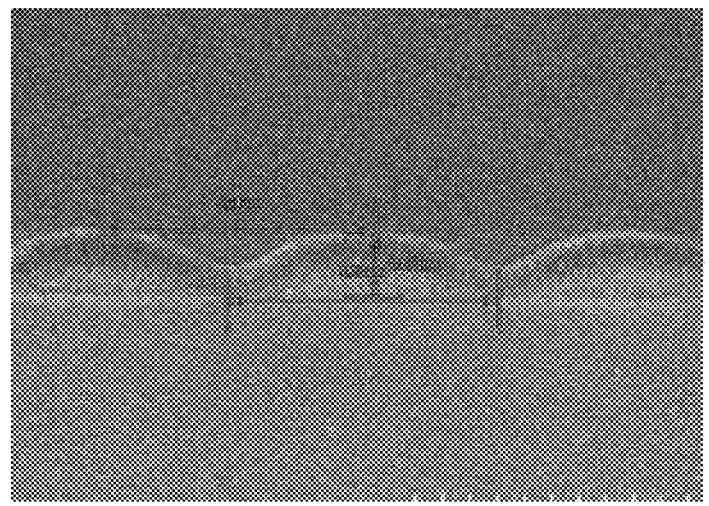
FIG. 9 is a scanning electron microscope (SEM) imaging diagram of a connection portion, in accordance with some embodiments of the present disclosure.
Figure 10:
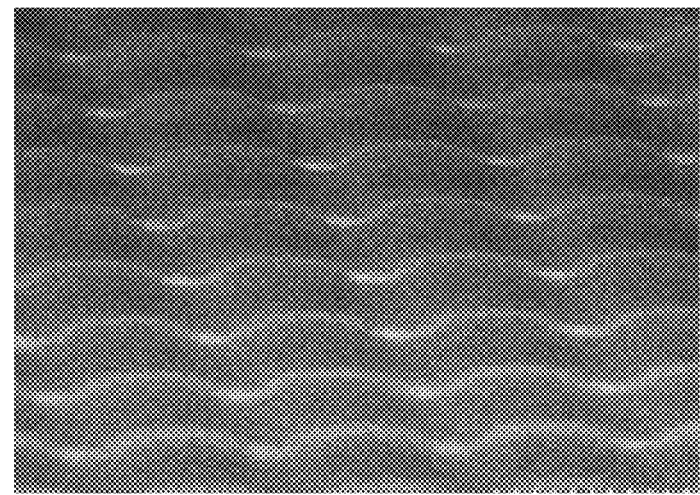
FIG. 10 is a SEM imaging diagram of another connection portion, in accordance with some embodiments of the present disclosure.

In the following, the connecting portion 6 is simulated by taking an example where the connecting portion 6 has a shape as shown in FIGS. 9 and 10.

Figure 11:
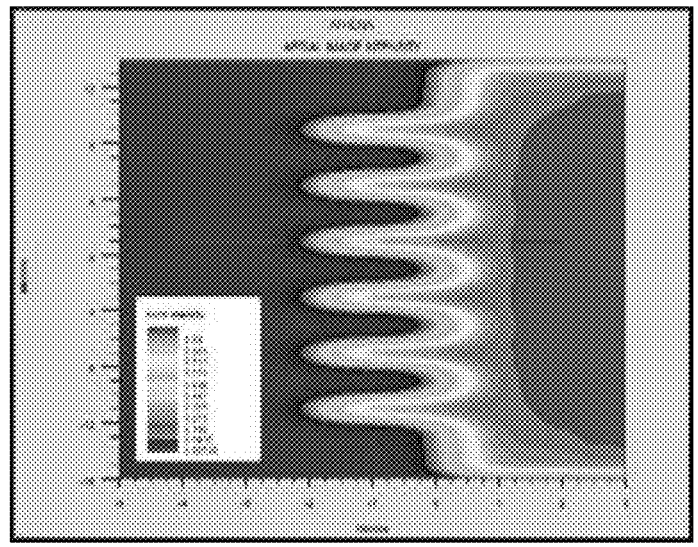
FIG. 11 is a schematic diagram of optical simulation of a display panel, in accordance with some embodiments of the present disclosure.
Figure 12:
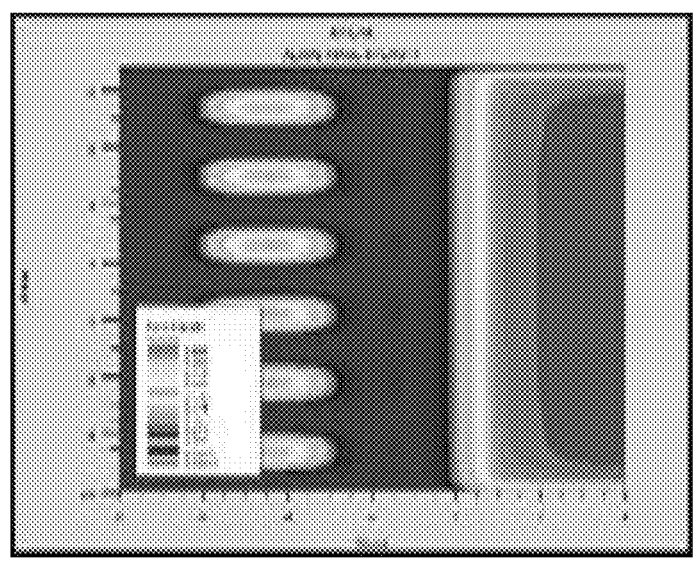
FIG. 12 is a schematic diagram of optical simulation of another display panel, in accordance with some embodiments of the present disclosure.
Figure 13:
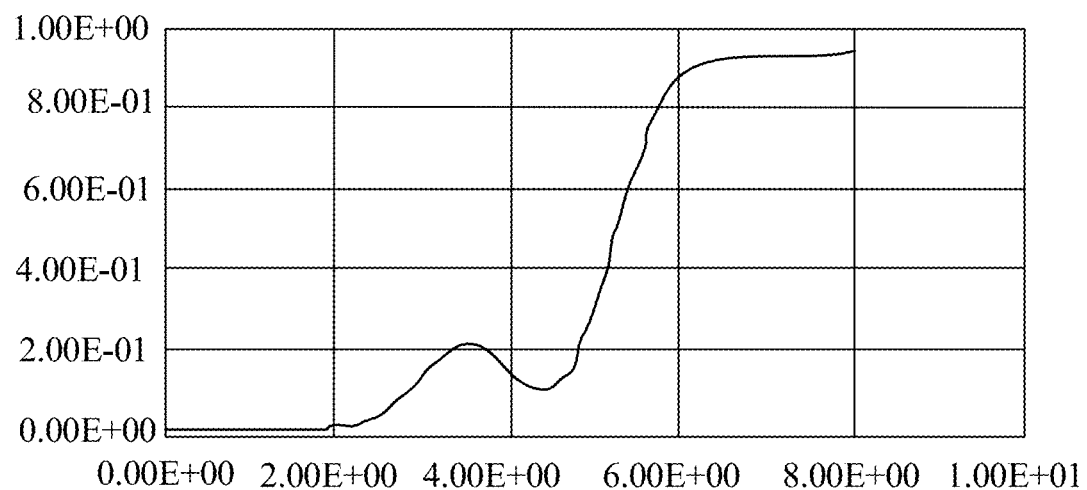
FIG. 13 is a graph of lateral light intensity distribution of the display panel shown in FIG. 12.
Figure 14:
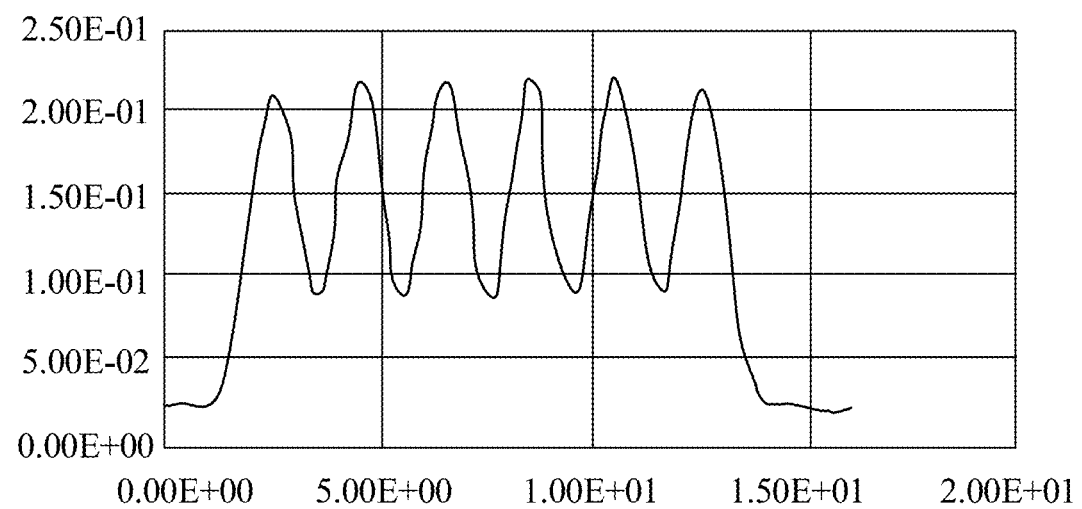
FIG. 14 is a graph of longitudinal light intensity distribution of the display panel shown in FIG. 12.
Figure 15:
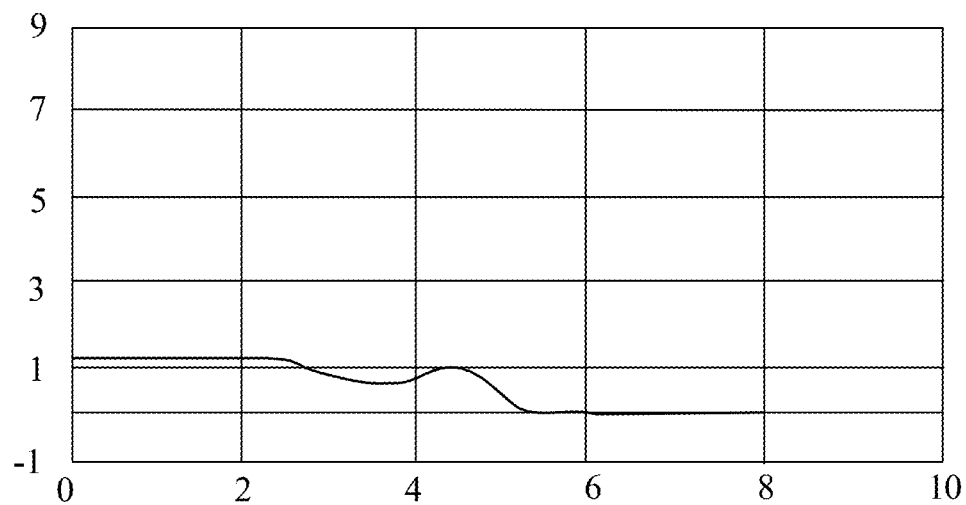
FIG. 15 is a graph of lateral film thickness distribution of a connection portion in the display panel shown in FIG. 12.
Figure 16:
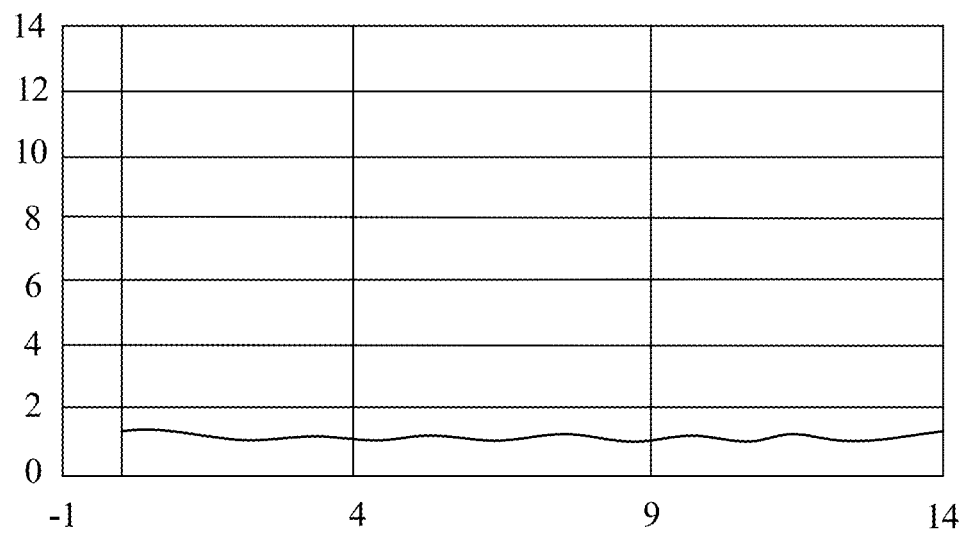
FIG. 16 is a graph of longitudinal film thickness distribution of a connection portion in the display panel shown in FIG. 12.

In some examples, a process simulation is performed on the connection portion 6. The TACD optical simulation results are shown in FIGS. 11 and 12. The simulation result shown in FIG. 12 corresponds to a structure in which the minimum distance between the edge of the orthogonal projection of the connection portion 6 on the base and the edge of the orthogonal projection of the pixel defining layer on the base 1 is 2 μm, and the simulation result shown in FIG. 11 corresponds to a structure in which the minimum distance between the edge of the orthogonal projection of the connection portion 6 on the base and the edge of the orthogonal projection of the pixel defining layer on the base 1 is 0 μm. FIG. 13 and FIG. 14 are a graph of light intensity distribution in the first direction X and a graph of longitudinal (i.e., in the second direction Y) light intensity distribution in FIG. 12, respectively, the abscissa represents position and the ordinate represents light intensity. FIG. 15 and FIG. 16 are a graph of lateral (i.e., in the first direction X) film thickness distribution and a graph of longitudinal (i.e., in the second direction Y) film thickness distribution of the connection portion 6 in FIG. 12, respectively, the abscissa represents the position, and the ordinate represents the film thickness (the unit is microns (μm)).

According to the meanings expressed in FIGS. 13 to 16, it can be seen that the connection portion 6 provided in some examples of the present disclosure may have a good diffuse reflection effect on the external ambient light.

Figure 17:
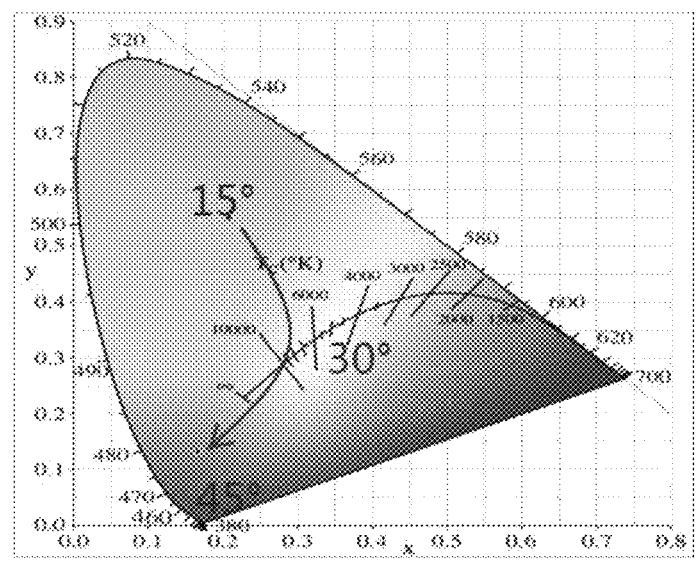
FIG. 17 is a schematic diagram of optical simulation of reflection effect of a cathode of an OLED on external ambient light in the related art.
Figure 18:
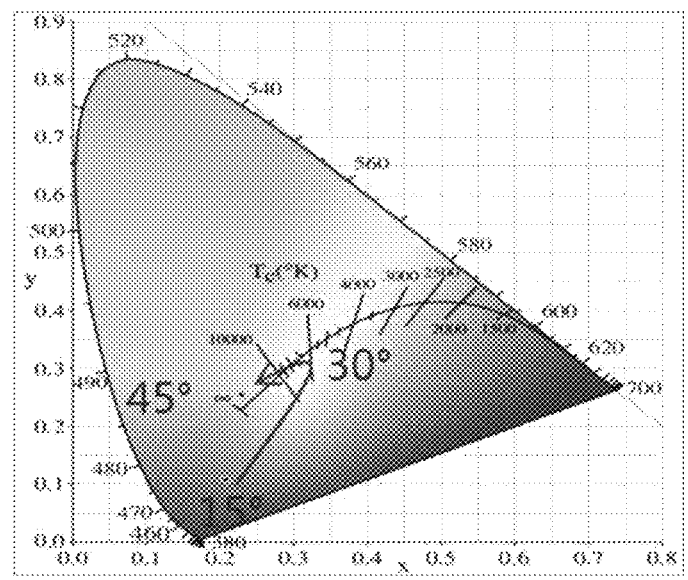
FIG. 18 is a schematic diagram of optical simulation of reflection effect of a connection portion on external ambient light, in accordance with some embodiments of the present disclosure.
Figures 19, 20:
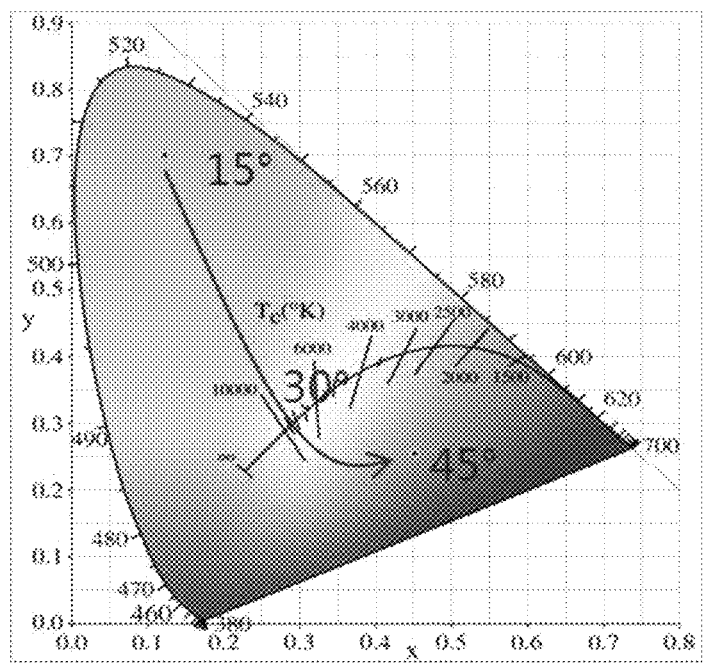
FIG. 19 is a schematic diagram of a comparison of reflection effects on external ambient light shown in FIGS. 17 and 18.
FIG. 20 is a schematic diagram of optical simulation of reflection effect of a cathode of another OLED on external ambient light in the related art.
Figures 21, 22:
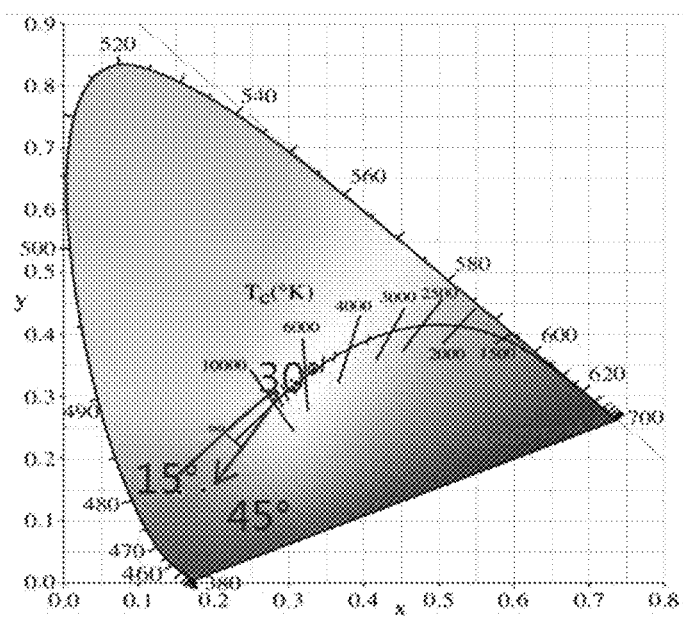
FIG. 21 is a schematic diagram of optical simulation of reflection effect of another connection portion on external ambient light, in accordance with some embodiments of the present disclosure.
FIG. 22 is a schematic diagram of a comparison of reflection effects on external ambient light shown in FIGS. 20 and 21.

In some other examples, a model simulation is performed on the connection portion 6. FIG. 17 and FIG. 20 respectively correspond to a reflection result of the cathode of the OLED to the external ambient light incident along the long axis direction of the sub-pixel and a reflection result of the cathode of the OLED to the external ambient light incident along the short axis direction of the sub-pixel in the related art. FIG. 18 and FIG. 21 show a reflection result of the connection portion 6 to the external ambient light incident along the long axis direction of the sub-pixel and a reflection result of the connection portion 6 to the external ambient light incident along the short axis direction of the sub-pixel in some examples of the present disclosure, respectively.

According to the meanings expressed in FIGS. 17 and 18 and FIGS. 20 and 21, it can be seen that for the external ambient light incident along the long axis direction of the sub-pixel or the external ambient light incident along the short axis direction of the sub-pixel, the movement range of color in some embodiments of the present disclosure is smaller compared with the related art at different viewing angles (that is, an included angle between the line of sight of the user and the direction perpendicular to the base 1, and the included angle is, for example, 15°, 30°, or 45°). That is, the color difference of the reflected light of the external ambient light is small at different viewing angles. Therefore, some embodiments of the present disclosure can effectively improve the color separation phenomenon by providing the connection portion 6.

Moreover, according to the meanings expressed in FIGS. 19 and 22, it can be seen that for the external ambient light incident along the long axis direction of the sub-pixel or the external ambient light incident along the short axis direction of the sub-pixel, the chromatic aberration in some embodiments of the present disclosure may be reduced compared with the related art at different viewing angles (that is, the included angle between the line of sight of the user and the direction perpendicular to the base 1, and the included angle is, for example, 15°, 30°, or 45°). That is, some embodiments of the present disclosure can effectively improve the color separation phenomenon by providing the connection portion 6.

It will be noted that, there are many ways to arrange the surface of the connection portion 6 away from the base 1 as an uneven rough surface with protrusions 61, which may be selected and set according to actual needs.

In some embodiments, as shown in FIG. 5, the surface of the portion of the pixel defining layer 4 in contact with the connection portion 6 is uneven, and the shape of the surface of the portion of the pixel defining layer 4 in contact with the connection portion 6 matches the shape of the connection portion 6.

In some examples, a material of the connection portion 6 is a conductive material, and the conductive material may be, for example, an oxide material such as an indium tin oxide (ITO), an indium zinc oxide (IZO), or an indium gallium zinc oxide (IGZO), or may also be a metal material such as silver (Ag). In the process of manufacturing the connection portion 6, a deposition process (e.g., a sputtering process) may be adopted. Since the surface of the portion of the pixel defining layer 4 in contact with the connection portion 6 is uneven, after the conductive material is deposited on the surface of the portion of the pixel defining layer 4 in contact with the connection portion 6, the connection portion 6 with a matching shape may be formed naturally, and the connection portion 6 is made to have protrusions 61 having the same or substantially the same shape as the surface of the portion of the pixel defining layer 4 in contact with the connection portion 6. As a result, the surface of the connection portion 6 away from the base 1 may be an uneven rough surface, which may diffusely reflect the external ambient light incident into the display panel 100, and improve the color separation phenomenon.

Figure 23:
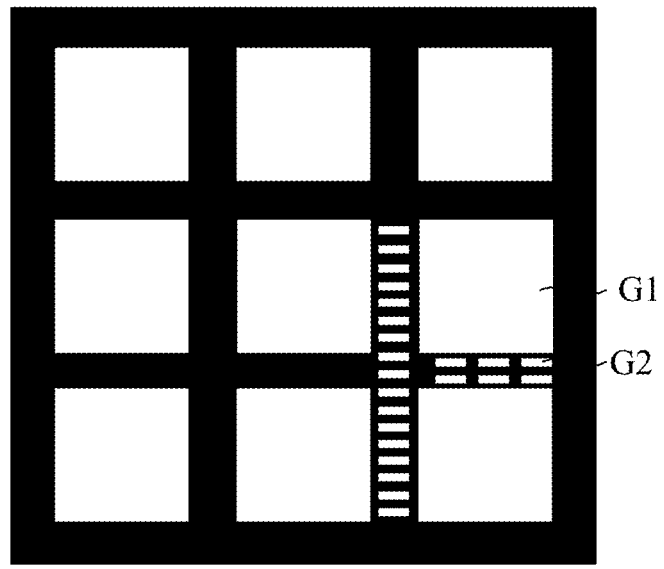
FIG. 23 is a schematic diagram of a mask used for manufacturing a pixel defining layer, in accordance with some embodiments of the present disclosure.
Figure 24:
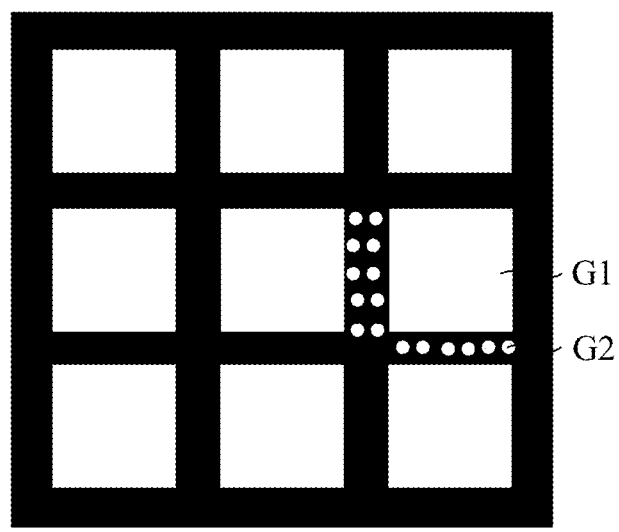
FIG. 24 is a schematic diagram of another mask used for manufacturing a pixel defining layer, in accordance with some embodiments of the present disclosure.

In some examples, in the process of manufacturing the pixel defining layer 4, for example, the masks as shown in FIGS. 23 and 24 may be used. That is, after a pixel defining film is formed, the mask may be used for etching the pixel defining film, and when the plurality of first openings K1 are formed by etching, an uneven surface for contact with the connection portion 6 is formed.

In this way, in the process of manufacturing the display panel 100, there is no need to add additional processes, and thus the production efficiency of the display panel 100 may be prevented from being affected, which is beneficial to the mass production of the display panel 100.

In the masks as shown in FIGS. 23 and 24, a first opening G1 corresponds to the first opening K1 of the pixel defining layer 4, and a second opening G2 corresponds to the surface of the pixel defining layer 4 for contact with the connection portion 6.

In some other embodiments, as shown in FIG. 6, in the planarization layer 3 included in the display panel 100, a surface, away from the base 1, of a portion thereof opposite to the connection portion 6 and has an uneven shape. A surface of a portion of the pixel defining layer 4 in contact with the uneven surface of the portion of the planarization layer 3 has an uneven shape and matches both the shape of the uneven surface of the portion of the planarization layer 3 and the shape of the connection portion 6.

In some examples, there is an overlapping portion between the orthogonal projection of the planarization layer 3 on the base 1 and the orthogonal projection of the connection portion 6 on the base 1, and the portion of the planarization layer 3 opposite to the connection portion 6 refers to a portion of the planarization layer 3 corresponding to the orthogonal projection of the overlapping portion.

Considering the formation material and manufacturing process of the pixel defining layer 4 and the formation material and manufacturing process of the connection portion 6, after the pixel defining layer 4 and the connection portion 6 are sequentially formed on the side of the planarization layer 3 away from the base 1, the surface of the portion of the pixel defining layer 4 in contact with the uneven surface of the portion of the planarization layer 3, and the connection portion 6 may naturally have a shape that match the uneven surface of the portion of the planarization layer 3, and the connection portion 6 may have protrusion 61 having the same or substantially the same shape as the uneven surface. As a result, the surface of the connection portion 6 away from the base 1 may be an uneven rough surface, which may diffusely reflect the external ambient light incident into the display panel 100, and improve the color separation phenomenon.

Figure 25:
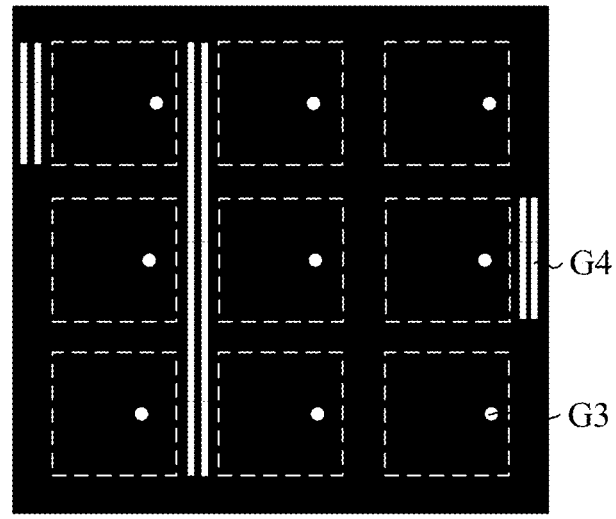
FIG. 25 is a schematic diagram of a mask used for manufacturing a planarization layer, in accordance with some embodiments of the present disclosure.
Figure 26:
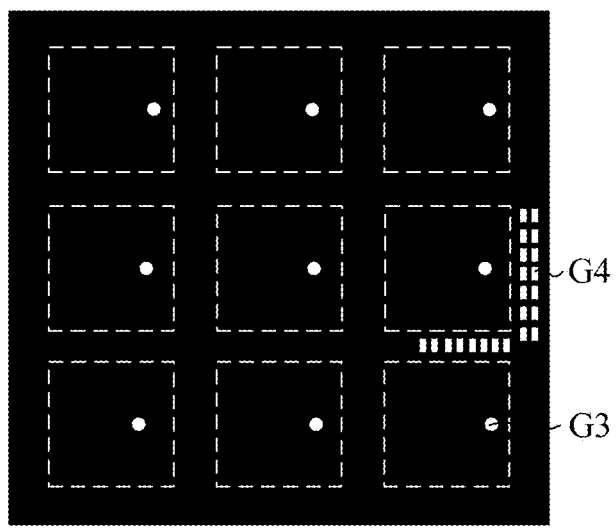
FIG. 26 is a schematic diagram of another mask used for manufacturing a planarization layer, in accordance with some embodiments of the present disclosure.
Figure 27:
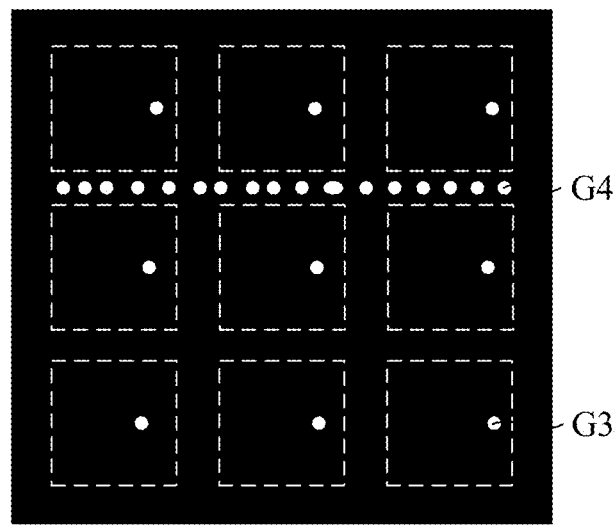
FIG. 27 is a schematic diagram of yet another mask used for manufacturing a planarization layer, in accordance with some embodiments of the present disclosure.

In some examples, in the process of manufacturing the planarization layer 3, for example, the masks as shown in FIGS. 25 to 27 may be adopted. That is, after a planarization film is formed, the mask may be used for etching the planarization film. When a via for electrically connecting the light-emitting device 5 and the pixel driving circuit 2 is formed by etching, an uneven surface opposite to the connection portion 6 is formed.

In this way, in the process of manufacturing the display panel 100, there is no need to add additional processes, and thus the production efficiency of the display panel 100 may be prevented from being affected, which is beneficial to the mass production of the display panel 100.

In the masks shown in FIGS. 25 to 27, a third opening G3 corresponds to the via of the planarization layer 3, and a fourth opening G4 corresponds to the surface of the portion of the planarization layer 3 opposite to the connection portion 6 and away from the base 1.

In yet some other embodiments, as shown in FIG. 7, the display panel 100 further includes a plurality of first bumps 7 having the same material and disposed in a same layer as sources and drains of the plurality of thin film transistors in the pixel driving circuits 2.

The sources and the drains of the plurality of thin film transistors include, for example, the first source 213 and the first drain 214 of the switching transistor 21, and the second source 223 and the second drain 224 of the driving transistor 22.

By arranging the plurality of first bumps 7 in the same layer as the first source 213, the first drain 214, the second source 223, and the second drain 224, the multiple structures may be formed simultaneously in a patterning process, which is beneficial to simplifying the manufacturing process of the display panel 100. Moreover, there is no need to add additional processes, which may avoid affecting the production efficiency of the display panel 100, and is beneficial to the mass production of the display panel 100.

In some examples, orthogonal projections of the plurality of first bumps 7 on the base 1 are located within the orthogonal projection of the at least one connection portion 6 on the base 1. A portion of the planarization layer 3 and a portion of the pixel defining layer 4 covering the plurality of first bumps 7 are uneven, and match the shape of the connection portion 6.

Considering the formation material and manufacturing process of the planarization layer 3, the formation material and manufacturing process of the pixel defining layer 4, and the formation material and manufacturing process of the connecting portion 6, after the planarization layer 3, the pixel defining layer 4 and the connection portion 6 are sequentially formed on a side of the plurality of first bumps 7 away from the base 1, the portion of the planarization layer 3 and the portion of the pixel defining layer 4 covering the plurality of first bumps 7 and the connection portion 6 are also naturally formed into an uneven structure. As a result, the surface of the connection portion 6 away from the base 1 may be an uneven rough surface, which may diffusely reflect the external ambient light incident into the display panel 100, and improve the color separation phenomenon.

The plurality of first bumps 7 may be of various shapes, which may be selected and set according to actual needs.

In some examples, the shape of the plurality of first bumps 7 may include at least one of a column (e.g., a cylinder or a right prism) and a strip.

In some examples, in the direction perpendicular to the base 1, the dimensions of the plurality of first bumps 7 may be in a range of 5000 Å to 9000 Å. The dimension may be, for example, an average dimension or the maximum dimension.

For example, in the direction perpendicular to the base 1, the dimensions of the plurality of first bumps 7 may be 5000 Å, 6000 Å, 7500 Å, 8000 Å, or 9000 Å.

In this way, the portion of the planarization layer 3 and the portion of the pixel defining layer 4 covering the first bumps 7 may form a relatively obvious uneven structure, and the connection portion 6 may have the protrusions 61 with a relatively obvious structure, and thus the surface of the connection portion 6 away from the base 1 may be a relatively obvious uneven rough surface, so as to ensure that the connection portion 6 has a good diffuse reflection effect on the external ambient light incident into the display panel 100, which effectively improves the color separation phenomenon.

In some examples, in the direction parallel to the base 1, the dimensions of the plurality of first bumps 7 may be in a range of 1 μm to 4 μm. The dimension may be, for example, the average dimension or the maximum dimension.

For example, in the direction parallel to the base 1, the dimensions of the plurality of first bumps 7 may be 1 μm, 2 μm, 2.5 μm, 3.4 μm, or 4 μm.

In this way, it may not only be possible to reduce the difficulty of manufacturing the first bumps 7 and avoid a situation that it is difficult to manufacture the first bumps 7, but it may also be possible to make the protrusions 61 on the connection portion 6 have a relatively appropriate size to avoid a situation that the size of the protrusion 61 is too large to form a good diffuse reflection of the external ambient light incident into the display panel 100.

In some examples, in the plurality of first bumps 7, a distance between two adjacent first bumps 7 may be in a range of 0.5 μm to 1.5 μm. The distance may refer to the minimum distance between edges of the orthogonal projections of the two adjacent first bumps 7 on the base 1.

For example, in the plurality of first bumps 7, the distance between the two adjacent first bumps 7 may be 0.5 μm, 0.7 μm, 1 μm, 1.3 μm, or 1.5 μm.

By setting the distance between the two adjacent first bumps 7 to be in the above range, it is possible to make two adjacent protrusions 61 on the connection portion 6 have a relatively suitable distance therebetween to avoid the phenomenon that an uneven appearance of the connection portion 6 is not obvious due to the distance between the two adjacent protrusions 61 being too small or too large. In this way, it may be ensured that the surface of the connection portion 6 away from the base 1 has a large uneven roughness, and thus the connection portion 6 may have a good diffuse reflection effect on the external ambient light incident into the display panel 100, which may effectively improve the color separation phenomenon.

In some examples, the minimum distance of a plurality of distances between the edges of the orthogonal projections of the plurality of first bumps 7 on the base 1 and the edge of the orthogonal projection of the pixel defining layer 4 on the base 1 may be in a range of 2 μm to 8 μm.

For example, the minimum distance may be 2 μm, 3 μm, 4 μm, 5 μm, 6.8 μm, or 8 μm.

By setting the minimum distance of the plurality of distances between the edges of the orthogonal projections of the plurality of first bumps 7 on the base 1 and the edge of the orthogonal projection of the pixel defining layer 4 on the base 1 to be in the above range, it may not only be possible to avoid a situation that the first bump 7 is electrically connected to the first electrode 51 of the light-emitting device 5 due to the minimum distance being too small, but it may also be possible to ensure the range of the minimum distance between the edge of the orthogonal projection of the connection portion 6 on the base 1 and the edge of the orthogonal projection of the pixel defining layer 4 on the base 1, thereby ensuring the improvement effect of the connection portion 6 on the color separation phenomenon.

In yet some other embodiments, as shown in FIG. 8, the display panel 100 further includes a plurality of post spacers 8 disposed on the side of the pixel defining layer 4 away from the base 1.

Here, in the case where the light-emitting layer 52 of the light-emitting device 5 is formed by using the evaporation process, it is needed to provide the plurality of post spacers 8 on the side of the pixel defining layer 4 away from the base 1 to support the display panel 100, so as to avoid damage to the display panel 100 during the process of forming the light-emitting layer 52 through evaporation.

In some examples, as shown in FIG. 8, the display panel 100 further includes: a plurality of second bumps 9 disposed between the pixel defining layer 4 and the connection portion 6. The plurality of second bumps 9 and the plurality of post spacers 8 are made of the same material and disposed in the same layer.

By arranging the plurality of second bumps 9 and the plurality of spacers 8 in the same layer, the plurality of second bumps 9 and the plurality of spacers 8 may be formed simultaneously in a patterning process, which is beneficial to simplifying the manufacturing process of the display panel 100. Moreover, there is no need to add additional processes, which may avoid affecting the production efficiency of the display panel 100, and is beneficial to the mass production of the display panel 100.

The plurality of second bumps 9 may be of various shapes, which may be selected and set according to actual needs.

In some examples, the shapes of the plurality of second bumps 9 may include at least one of a column (for example, a cylinder or a right prism) and a strip.

In some examples, as shown in FIG. 8, the shape of the connection portion 6 matches the shapes of the plurality of second bumps 9.

For example, the connection portion 6 is located on a surface of the plurality of second bumps 9 away from the base 1. Considering the formation material and manufacturing process of the connection portion 6, after the connection portion 6 is formed on the surface of the plurality of second bumps 9 away from the base 1, the connection portion 6 may naturally have an uneven structure that matches the shapes of the plurality of second bumps 9, and thus the surface of the connection portion 6 away from the base 1 may be an uneven rough surface, which may diffusely reflect the external ambient light incident into the display panel 100 and improve the color separation phenomenon.

In some examples, in the direction parallel to the base 1, the dimensions of the plurality of second bumps 9 may be in a range of 0.5 µm to 3 µm. The dimension may be, for example, the average dimension or the maximum dimension, or the side length of the figure of the orthogonal projection of the second bump 9 on the base 1.

For example, in the direction parallel to the base 1, the dimensions of the plurality of second bumps 9 may be 0.5 µm, 1 µm, 1.5 µm, 2.2 µm, or 3 µm.

In this way, it may not only be possible to reduce the difficulty of manufacturing the second bumps 9 and avoid a situation that it is difficult to manufacture the second bumps 9, but it may also be possible to make the protrusions 61 on the connection portion 6 have a relatively appropriate size to avoid the situation that the size of the protrusion 61 is too large to form a good diffuse reflection of the external ambient light incident into the display panel 100.

In some examples, in the plurality of second bumps 9, a distance between two adjacent second bumps 9 is greater than 0 µm and less than or equal to 3 µm. The distance may be referred to the minimum distance between edges of the orthogonal projections of the two adjacent second bumps 9 on the base 1.

For example, in the plurality of second bumps 9, the distance between the two adjacent second bumps 9 may be 0.5 µm, 1.3 µm, 2 µm, 2.6 µm, or 3 µm.

By setting the distance between the two adjacent second bumps 9 to be in the above range, it is possible to make two adjacent protrusions 61 on the connection portion 6 have a relatively suitable distance therebetween to avoid the phenomenon that the uneven appearance of the connection portion 6 is not obvious due to the distance between the two adjacent protrusions 61 being too small or too large. In this way, it may be ensured that the surface of the connection portion 6 away from the base 1 has a large uneven roughness, and thus the connection portion 6 may have a good diffuse reflection effect on the external ambient light incident into the display panel 100, which may effectively improve the color separation phenomenon.

In some examples, the minimum distance of a plurality of distances between the edges of the orthogonal projections of the plurality of second bumps 9 on the base 1 and the edge of the orthogonal projection of the pixel defining layer 4 on the base 1 may be in a range of 2 µm to 8 µm.

For example, the minimum distance may be 2 µm, 3 µm, 4 µm, 5 µm, 6.8 µm, or 8 µm.

By setting the minimum distance of the plurality of distances between the edges of the orthogonal projections of the plurality of second bumps 9 on the base 1 and the edge of the orthogonal projection of the pixel defining layer 4 on the base 1 to be in the above range, it may not only be possible to avoid a situation that the minimum distance is too small to cause an adverse effect on the evaporation process, but it may also be possible to ensure the range of the minimum distance between the edge of the orthogonal projection of the connection portion 6 on the base 1 and the edge of the orthogonal projection of the pixel defining layer 4 on the base 1, thereby ensuring the improvement effect of the connection portion 6 on the color separation phenomenon.

Figure 28:
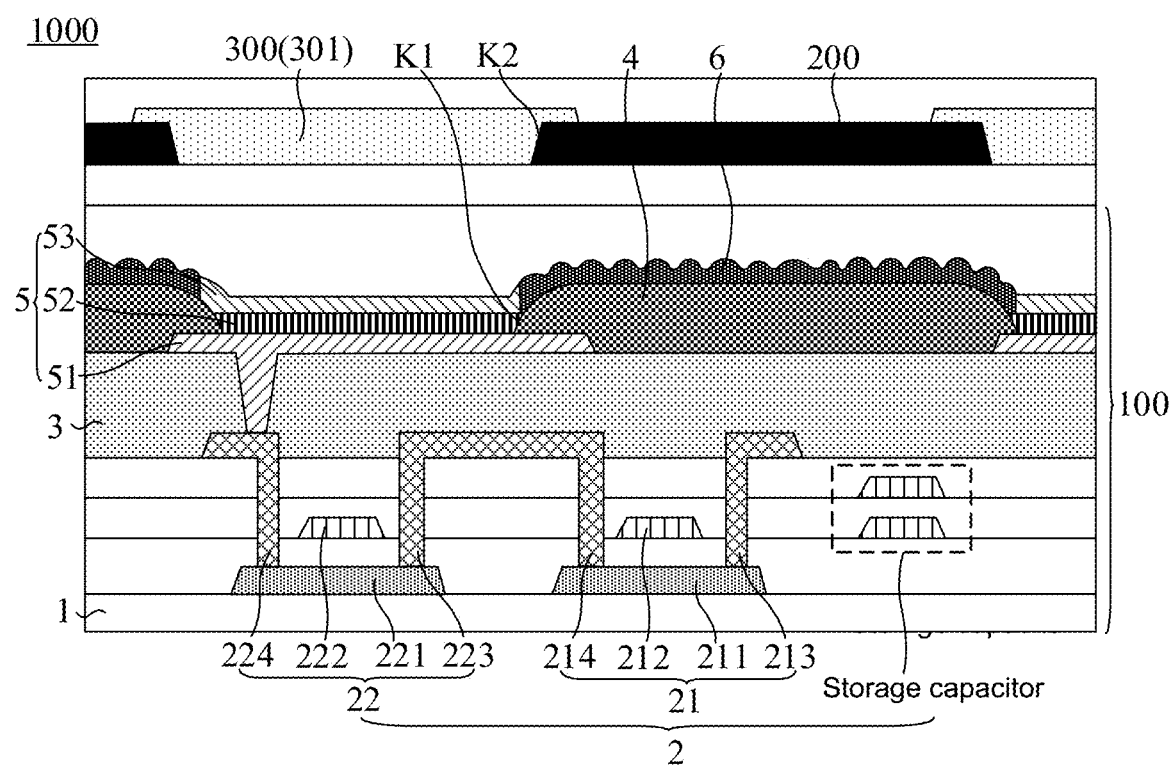
FIG. 28 is a diagram showing a structure of a display apparatus, in accordance with some embodiments of the present disclosure.
Figure 29:
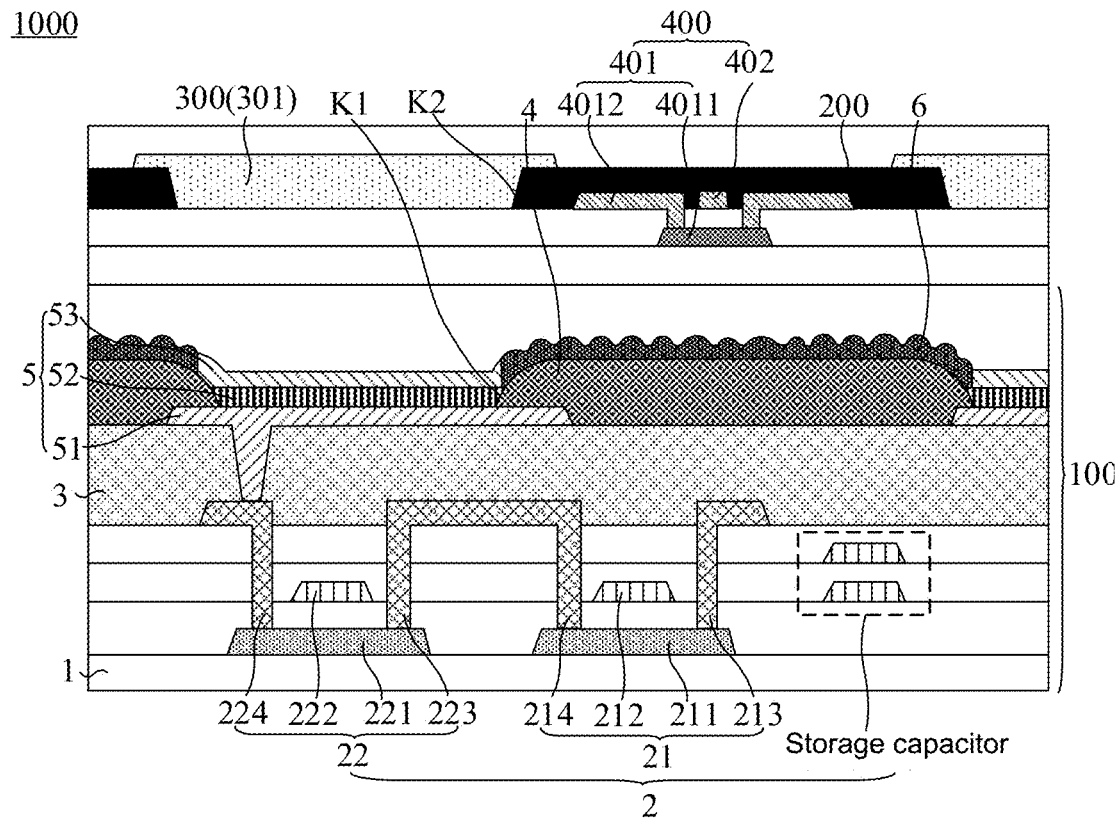
FIG. 29 is a diagram showing a structure of another display apparatus, in accordance with some embodiments of the present disclosure.

Some embodiments of the present disclosure provide a display apparatus 1000. As shown in FIGS. 28 and 29, the display apparatus 1000 includes the display panel 100 as described in any of the above embodiments.

The display apparatus 1000 provided by some embodiments of the present disclosure has the same beneficial effects as the display panel 100 provided by some of the above embodiments, which will not be repeated herein.

In some embodiments, as shown in FIGS. 28 and 29, the display apparatus 1000 further includes: a black matrix 200 disposed on a light exit side of the display panel 100, and a color filter layer 300 disposed on a side of the black matrix 200 away from the display panel 100.

Here, in the case where the light-emitting device 5 in the display panel 100 is a top-emission-type light-emitting device, the light exit side of the display panel 100 is the side of the light-emitting device 5 away from the base 1.

In some examples, the display panel 100 further includes an encapsulation layer disposed on the side of the light-emitting device 5 and the connection portion 6 away from the base 1. The black matrix 200 is disposed on a side of the encapsulation layer away from the base 1.

The encapsulation layer may block external oxygen and/or water vapor, so as to avoid affecting the luminous efficiency and service life of the light-emitting device 5 due to the light-emitting device 5 being corroded by the external oxygen and/or water vapor.

In some examples, an orthogonal projection of the black matrix 200 on the base 1 coincides with the orthogonal projection of the pixel defining layer 4 on the base 1; or, the orthogonal projection of the black matrix 200 on the base 1 is located within the orthogonal projection of the pixel defining layer 4 on the base 1, and the minimum distance between an edge of the orthogonal projection of the black matrix 200 on the base 1 and the edge of the orthogonal projection of the pixel defining layer 4 on the base 1 is less than or equal to 6 µm.

In this way, it may be possible to effectively reduce the reflectivity of the display panel 100 to the external ambient light through the black matrix 200, and it may also prevent the black matrix 200 from adversely affecting the normal light emission of the display panel 100.

In some examples, as shown in FIGS. 28 and 29, the black matrix 200 has a plurality of second openings K2. The color filter layer 300 has a plurality of color filter portions 301, and at least a portion of the color filter portion 301 is located in a second opening K2. That is, the entire color filter portion 301 may be located in a second opening K2, or, as shown in FIGS. 28 and 29, a portion of the color filter portion 301 may be located in a second opening K2, and the other portion is located on a surface of the black matrix 200 away from the display panel 100.

Here, the plurality of color filter portions 301 includes color filter portions of multiple colors. The color of the color filter portion 301 is the same as the color of light emitted by a corresponding light-emitting device 5.

In some examples, the minimum distance between the edge of the orthogonal projection of the black matrix 200 on the base 1 and the edge of the orthogonal projection of the at least one connection portion 6 of the display panel 100 on the base 1 may be in a range of 0 μm to 6 μm.

Since the minimum distance between the edge of the orthogonal projection of the black matrix 200 on the base 1 and the edge of the orthogonal projection of the pixel defining layer 4 on the base 1 may be in a range of 0 μm to 6 μm, and the minimum distance between the edge of the orthogonal projection of the connection portion 6 on the base 1 and the edge of the orthogonal projection of the pixel defining layer 4 on the base 1 may be in a range of 0 μm to 8 μm, this means that the orthogonal projection of the connection portion 6 on the base 1 may be within the orthogonal projection of the black matrix 200 on the base 1, or a portion of the orthogonal projection of the connection portion 6 on the base 1 overlaps with a portion of the orthogonal projection of the black matrix 200 on the base 1.

In some embodiments, as shown in FIG. 29, the display apparatus 1000 further includes a touch structure 400 disposed between the display panel 100 and the black matrix 200. An orthogonal projection of the touch structure 400 on the base 1 is within the orthogonal projection of the black matrix 200 on the base 1.

Since the touch structure 400 is made of a conductive material, and the conductive material generally has high light reflectivity, by making the orthogonal projection of the touch structure 400 on the base 1 to be within the orthogonal projection of the black matrix 200 on the base 1, it is possible to reduce or even avoid a situation that the touch structure 400 reflects the external ambient light incident into the display apparatus 1000, which may reduce the reflectivity of the display apparatus 1000 to the external ambient light, and avoid affecting the display effect of the display apparatus 1000.

Figure 30:
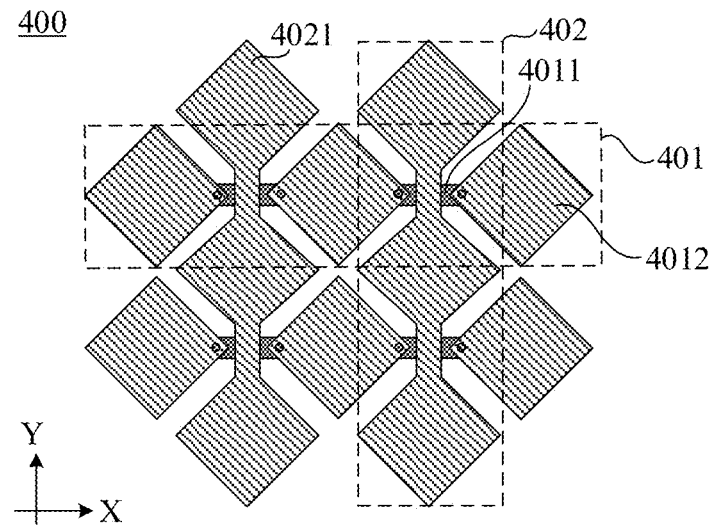
FIG. 30 is a diagram showing a structure of a touch structure, in accordance with some embodiments of the present disclosure.

In some examples, as shown in FIGS. 29 and 30, the touch structure 400 includes: a plurality of conductive bridges 4011 disposed on the side of the encapsulation layer away from the base 1. The conductive bridges 4011 are arranged, for example, in an array.

For example, as shown in FIG. 30, the touch structure 400 further includes: a plurality of rows of first touch sub-electrodes 4012 disposed on a side of the plurality of conductive bridges 4011 away from the base 1. Each row of first touch sub-electrodes 4012 includes a plurality of first touch sub-electrodes 4012 arranged at intervals in the first direction X. In each row of first touch sub-electrodes 4012, each two adjacent first touch sub-electrodes 4012 are electrically connected to a conductive bridge 4011, so that the plurality of rows of first touch sub-electrodes 4012 and the plurality of conductive bridges 4011 constitute a plurality of first touch electrodes 401.

For example, as shown in FIG. 30, the touch structure 400 further includes: a plurality of second touch electrodes 402 disposed on the side of the plurality of conductive bridges 4011 away from the base 1 and disposed in a same layer as the plurality of rows of first touch sub-electrodes 4012. The plurality of second touch electrodes 402 extend in the second direction Y. The second touch electrode 402 includes a plurality of second touch sub-electrodes 4021 connected in series. The second touch electrodes 402 are of, for example, an integrated structure.

By arranging the plurality of rows of first touch sub-electrodes 4012 and the plurality of second touch electrodes 402 in the same layer, it is possible to manufacture the plurality of rows of first touch sub-electrodes 4012 and the plurality of second touch electrodes 402 simultaneously in a patterning process, which is beneficial to simplifying the manufacturing process of the display apparatus 1000.

In some embodiments, the display apparatus 1000 may be any product or to component having a display function, such as a mobile phone, a tablet computer, a television, a display, a notebook computer, a digital photo frame, or a navigator.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a base;
   a pixel defining layer disposed on a side of the base, the pixel defining layer having a plurality of first openings;
   a plurality of light-emitting devices disposed on a side of the base, at least a portion of each light-emitting device being located in a first opening, and the light-emitting device including a first electrode, a light-emitting layer, and a second electrode that are sequentially stacked in a direction perpendicular to the base and away from the base; and
   at least one connection portion disposed on a side of the pixel defining layer away from the base, an orthogonal projection of a connection portion on the base being located within an orthogonal projection of the pixel defining layer on the base; the connection portion and the second electrode being made of a same material and disposed in a same layer, and the connection portion being electrically connected to at least two adjacent second electrodes; wherein
   a surface of the connection portion away from the base has a plurality of protrusions, and the connection portion is configured to diffusely reflect external ambient light incident into the display panel; and
   in the direction perpendicular to the base, dimensions of the plurality of protrusions are greater than 0 μm and less than or equal to 2 μm;
   the display panel further comprising:
   a planarization layer, the pixel defining layer and a first electrode layer where a plurality of first electrodes are located are disposed on a side of the planarization layer away from the base;
   a surface, away from the base, of a portion of the planarization layer opposite to the connection portion is uneven; and
   a surface of a portion of the pixel defining layer in contact with the uneven surface of the portion of the planarization layer is uneven, and matches both a shape of the uneven surface of the portion of the planarization layer and a shape of the connection portion.

2. The display panel according to claim 1, wherein a surface of a portion of the pixel defining layer in contact with the connection portion is uneven; and
   a shape of the surface of the portion of the pixel defining layer in contact with the connection portion matches a shape of the connection portion.

3. The display panel according to claim 1, wherein a shape of the orthogonal projection of the connection portion on the base has a block shape, a strip shape, or a shape formed by connecting a plurality of strip shapes.

4. The display panel according to claim 1, wherein a number of the at least one connection portion is one, and a shape of the orthogonal projection of the connection portion on the base is the same as a shape of the orthogonal projection of the pixel defining layer on the base; and the connection portion is electrically connected to second electrodes of the plurality of light-emitting devices.

5. The display panel according to claim 1, wherein a minimum distance between an edge of the orthogonal projection of the connection portion on the base and an edge of the orthogonal projection of the pixel defining layer on the base is in a range of 0 μm to 8 μm.

6. The display panel according to claim 1, wherein a shape of an orthogonal projection of a protrusion on the base has a strip shape, a circle shape, or a polygon shape.

7. A display apparatus, comprising:

the display panel according to claim 1;

a black matrix disposed on a light exit side of the display panel, and the black matrix having a plurality of second openings; and a color filter layer disposed on a side of the black matrix away from the display panel, the color filter layer including a plurality of color filter portions, and at least a portion of a color filter portion being located in a second opening; wherein a minimum distance between an edge of an orthogonal projection of the black matrix on the base of the display panel and an edge of an orthogonal projection of the at least one connection portion of the display panel on the base is in a range of 0 μm to 6 μm.

8. The display apparatus according to claim 7, further comprising: a touch structure disposed between the display panel and the black matrix; and an orthogonal projection of the touch structure on the base is within an orthogonal projection of the black matrix on the base.

9. A display panel, comprising:

a base;

a pixel defining layer disposed on a side of the base, the pixel defining layer having a plurality of first openings;

a plurality of light-emitting devices disposed on a side of the base, at least a portion of each light-emitting device being located in a first opening, and the light-emitting device including a first electrode, a light-emitting layer, and a second electrode that are sequentially stacked in a direction perpendicular to the base and away from the base; and at least one connection portion disposed on a side of the pixel defining layer away from the base, an orthogonal projection of a connection portion on the base being located within an orthogonal projection of the pixel defining layer on the base; the connection portion and the second electrode being made of a same material and disposed in a same layer, and the connection portion being electrically connected to at least two adjacent second electrodes; wherein a surface of the connection portion away from the base has a plurality of protrusions, and the connection portion is configured to diffusely reflect external ambient light incident into the display panel; and in the direction perpendicular to the base, dimensions of the plurality of protrusions are greater than 0 μm and less than or equal to 2 μm;

the display panel further comprising:

a planarization layer, the pixel defining layer and a first electrode layer where a plurality of first electrodes are located are disposed on a side of the planarization layer away from the base;

a plurality of pixel driving circuits disposed between the base and the planarization layer, and electrically connected to the plurality of light-emitting devices; and a plurality of first bumps with a same material and disposed in a same layer as sources and drains of a plurality of thin film transistors in the plurality of pixel driving circuits; wherein orthogonal projections of the plurality of first bumps on the base are located within the orthogonal projection of the at least one connection portion on the base; and a portion of the planarization layer and a portion of the pixel defining layer covering the plurality of first bumps are uneven, and match a shape of the connection portion.

10. The display panel according to claim 9, wherein in the direction perpendicular to the base, dimensions of the plurality of first bumps are in a range of 5000 Å to 9000 Å.

11. The display panel according to claim 9, wherein in a direction parallel to the base, dimensions of the plurality of first bumps are in a range of 1 μm to 4 μm.

12. The display panel according to claim 9, wherein in the plurality of first bumps, a distance between two adjacent first bumps is in a range of 0.5 μm to 1.5 μm.

13. The display panel according to claim 9, wherein a minimum distance of a plurality of distances between edges of orthogonal projections of the plurality of first bumps on the base and an edge of the orthogonal projection of the pixel defining layer on the base is in a range of 2 μm to 8 μm.

* * * * *